(12) United States Patent
Dai et al.

(10) Patent No.: US 9,915,758 B2
(45) Date of Patent: Mar. 13, 2018

(54) MOLD FOR MANUFACTURING OPTICAL ELEMENT AND PRODUCTION METHOD FOR SAME, AND OPTICAL ELEMENT

(71) Applicant: Oji Holdings Corporation, Tokyo (JP)

(72) Inventors: Kotaro Dai, Tokyo (JP); Kei Shinotsuka, Kawasaki (JP); Yoshihisa Hatta, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 141 days.

(21) Appl. No.: 14/647,974

(22) PCT Filed: Dec. 11, 2013

(86) PCT No.: PCT/JP2013/083250
§ 371 (c)(1),
(2) Date: May 28, 2015

(87) PCT Pub. No.: WO2014/092132
PCT Pub. Date: Jun. 19, 2014

(65) Prior Publication Data
US 2015/0301230 A1    Oct. 22, 2015

(30) Foreign Application Priority Data

Dec. 13, 2012   (JP) .................. 2012-272227

(51) Int. Cl.
*G02B 1/11*       (2015.01)
*B29C 33/38*      (2006.01)
(Continued)

(52) U.S. Cl.
CPC ............ *G02B 1/11* (2013.01); *B29C 33/38* (2013.01); *B29C 33/424* (2013.01);
(Continued)

(58) Field of Classification Search
CPC .................. B29C 33/38; B29C 59/046
See application file for complete search history.

(56) References Cited

U.S. PATENT DOCUMENTS

2007/0229942 A1   10/2007   Horie et al.
2009/0176015 A1    7/2009   Nakanishi et al.
(Continued)

FOREIGN PATENT DOCUMENTS

JP    A-03-252936      11/1991
JP    A-2001-121582     5/2001
(Continued)

OTHER PUBLICATIONS

Duffel et al., Journal of Materials and Chemistry, vol. 11, 3333 (2001).
(Continued)

*Primary Examiner* — Joseph S Del Sole
*Assistant Examiner* — Thu Khanh T. Nguyen
(74) *Attorney, Agent, or Firm* — Knobbe Martens Olson & Bear LLP

(57) ABSTRACT

A mold for manufacturing an optical element is provided with a base material, and a recessing and protruding layer formed on a surface of the base material. The recessing and protruding structure of the recessing and protruding layer having a plurality of areas continuously arranged in a positional relationship in which the central point of seven adjacent protrusions is an intersection point of diagonal lines of six vertices of a regular hexagon, and the areas, shapes, and crystal orientations of the plurality of areas are random.

4 Claims, 8 Drawing Sheets

(51) Int. Cl.
  *G02B 1/118* (2015.01)
  *B29C 33/42* (2006.01)
  *G02B 1/10* (2015.01)
  *B29D 11/00* (2006.01)
  *B29C 37/00* (2006.01)
  *B29L 11/00* (2006.01)

(52) U.S. Cl.
  CPC .......... *B29D 11/00326* (2013.01); *G02B 1/10* (2013.01); *G02B 1/118* (2013.01); *B29C 37/0053* (2013.01); *B29L 2011/00* (2013.01); *H01L 2933/0083* (2013.01); *H01L 2933/0091* (2013.01)

(56) References Cited

U.S. PATENT DOCUMENTS

| | | | |
|---|---|---|---|
| 2009/0274873 A1 | 11/2009 | Shinotsuka | |
| 2011/0199685 A1* | 8/2011 | Ito | B32B 3/30 359/589 |
| 2012/0043297 A1* | 2/2012 | Fujii | B29C 33/38 425/385 |
| 2014/0197036 A1* | 7/2014 | Isurugi | B29C 33/38 205/112 |

FOREIGN PATENT DOCUMENTS

| | | |
|---|---|---|
| JP | A-2004-268331 | 9/2004 |
| JP | A-2009-034630 | 2/2009 |
| JP | A-2009-128538 | 6/2009 |
| JP | A-2009-162831 | 7/2009 |
| JP | A-2009-162965 | 7/2009 |
| JP | A-2009-175401 | 8/2009 |
| JP | A-2009-223154 | 10/2009 |
| JP | A-2009-292703 | 12/2009 |
| JP | A-2011-034648 | 2/2011 |
| JP | A-2012-020389 | 2/2012 |
| JP | A-2012-028067 | 2/2012 |
| KR | 10-2012-0082179 A | 7/2012 |
| TW | 201239538 A1 | 10/2012 |
| WO | WO 2008/001670 A1 | 1/2008 |

OTHER PUBLICATIONS

Szekeres et al., Journal of Materials and Chemistry, vol. 12, 3268 (2002).
International Search Report in International Application No. PCT/JP2013/083250, dated Mar. 11, 2014.
Office Action in Chinese Patent Application No. 201380059083.5, dated Aug. 16, 2016.
Office Action in Japanese Patent Application No. 2014-552072, dated Aug. 23, 2016.
Search Report in European Patent Application No. 13862654.4, dated Aug. 19, 2016.
Office Action in Taiwanese Patent Application No. 102146249, dated Jun. 3, 2017.
Office Action in Korean Patent Application No. 10-2015-7011779, dated Apr. 29, 2016.

* cited by examiner

… (1)

MOLD FOR MANUFACTURING OPTICAL ELEMENT AND PRODUCTION METHOD FOR SAME, AND OPTICAL ELEMENT

This application is the U.S. National Phase under 35 U.S.C. § 371 of International Application No. PCT/JP2013/083250, filed Dec. 11, 2013, designating the U.S., and published in Japanese as WO 2014/092132 on Jun. 19, 2014, which claims priority to Japanese Patent Application No. 2012-272227, filed Dec. 13, 2012, the entire contents of which are incorporated herein by reference.

TECHNICAL FIELD

The present invention relates to a mold used for manufacturing an optical element such as an antireflective body, a method of producing the same, and an optical element.

The present application claims priority based on Japanese Patent Application No. 2012-272227 filed on Dec. 13, 2012, the content of which is incorporated herein by reference.

BACKGROUND ART

In light-emitting devices such as organic electroluminescent (organic EL) devices or light-emitting diodes, optical elements such as antireflective bodies having fine recesses and protrusions are sometimes mounted on the light extraction face in order to improve light extraction efficiency.

A method that has been widely employed to produce optical elements is to mold resin using a mold. As molds for producing optical elements, those provided with a recessing and protruding layer having fine recesses and protrusions have been used on the surface of a base material (Patent Literature 1 to 4).

CITATION LIST

Patent Literature

[Patent Literature 1]
Japanese Unexamined Patent Application Publication No. Hei 03-252936A
[Patent Literature 2]
Japanese Unexamined Patent Application Publication No. 2001-121582A
[Patent Literature 3]
Japanese Unexamined Patent Application Publication No. 2004-268331A
[Patent Literature 4]
Japanese Unexamined Patent Application Publication No. 2009-292703A

SUMMARY OF INVENTION

Technical Problem

However, any optical elements obtained using the molds described in Patent Literature 1 to 4 tend to have high directionality of diffracted light. For example, in an antireflective body, when directionality of diffracted light is high, color shifting occurs depending on a viewing angle. When the transmitted light is white, light that has passed through the antireflective body appears colored, and when the transmitted light is colored, light that has passed through the antireflective body appears as a color different from the original color. Furthermore, when, for example, the recessing and protruding structure of the antireflective body has a grating structure for the purpose of use in an organic EL device or the like, it is difficult to obtain a uniform optical effect as a light-emitting device because the diffracted light produced by the grating structure is anisotropic with respect to an X-Y in-plane direction.

To reduce directionality of diffracted light, the fine recesses and protrusions of a grating structure may be given a random arrangement. With random recesses and protrusions, however, the pitch of the recesses and protrusions cannot be adjusted, and it is difficult to obtain the targeted optical function.

An object of the present invention is to provide a mold for manufacturing an optical element and a method for producing the same, by which an optical element that can reduce directionality of diffracted light can be easily manufactured and the pitch of the recesses and protrusions can be adjusted. Another object of the present invention is to provide an optical element that can reduce directionality of diffracted light.

Solution to Problem

The present invention has the following aspects.

[1] A mold for manufacturing an optical element includes a base material, and a recessing and protruding layer formed on a surface of the base material. The recessing and protruding layer has a recessing and protruding structure having a plurality of areas continuously arranged in a positional relationship in which the central point of seven adjacent protrusions is an intersection point of diagonal lines of six vertices of a regular hexagon, and the areas, shapes, and crystal orientations of the plurality of areas are random.

That is, a mold for manufacturing an optical element includes a base material, and a recessing and protruding layer formed on a surface of the base material, having a recessing and protruding structure. The recessing and protruding structure having a plurality of areas continuously arranged in a positional relationship in which the central point of seven adjacent protrusions is an intersection point of diagonal lines of six vertices of a regular hexagon, and the areas, shapes, and crystal orientations of the plurality of areas are random.

[2] In the mold for manufacturing an optical element according to [1], the recessing and protruding layer formed by a material containing (A1) and at least one of (B) to (D) below.

(A1) is a metal containing Si, Cr, Mo, W, Ta, Ti, or an alloy containing at least two of these elements; (B) is a metal oxide of at least one element selected from the group consisting of Si, Cr, Mo, W, Ta, Ni, and Ti; (C) is a metal nitride of at least one element selected from the group consisting of Si, Cr, Mo, W, Ta, Ni, and Ti; and (D) is a metal carbide of at least one element selected from the group consisting of Si, Cr, Mo, W, Ta, Ni, and Ti.

Alternatively, in the mold for manufacturing an optical element according to [1], the recessing and protruding layer is formed by a material containing at least one of (A) to (D) below.

(A) is a metal containing Si, Cr, Mo, W, Ta, Ni, Ti, or an alloy containing at least two of Si, Cr, Mo, W, Ta, Ni, and Ti; (B) is a metal oxide of at least one element selected from the group consisting of Si, Cr, Mo, W, Ta, Ni, and Ti; (C) is a metal nitride of at least one element selected from the group consisting of Si, Cr, Mo, W, Ta, Ni, and Ti; and (D) is a metal carbide of at least one element selected from the group consisting of Si, Cr, Mo, W, Ta, Ni, and Ti.

[3] In the mold for manufacturing an optical element according to [1] or [2], the surface of the base material is flat.

In the mold for manufacturing an optical element according to [1] or [2], the surface of the base material has one of a concave curved face and a convex curved face.

[5] A method for producing a mold for manufacturing an optical element includes the steps of a film deposition step of depositing an inorganic film on a surface of a base material, a particle arrangement step of arranging a plurality of particles in a monolayer on a surface of the inorganic film, and an etching step of dry-etching the inorganic film using the plurality of particles as an etching mask.

[6] In the method for producing a mold for manufacturing an optical element according to [5], the particle arrangement step has a single-particle film formation step of forming a single-particle film on a surface of water, and a transfer step of transferring the single-particle film onto the surface of the inorganic film.

[7] In the method for producing a mold for manufacturing an optical element according to [4] or [5], the inorganic film is formed by a material containing (A1) and at least one of (B) to (D) below.

(A1) is a metal containing Si, Cr, Mo, W, Ta, Ti, or an alloy containing at least two of Si, Cr, Mo, W, Ta, Ni, and Ti; (B) is a metal oxide of at least one element selected from the group consisting of Si, Cr, Mo, W, Ta, Ni, and Ti; (C) is a metal nitride of at least one element selected from the group consisting of Si, Cr, Mo, W, Ta, Ni, and Ti; (D) is a metal carbide of at least one element selected from the group consisting of Si, Cr, Mo, W, Ta, Ni, and Ti.

Alternatively, in the method for producing a mold for manufacturing an optical element according to [5] or [6], the inorganic film is formed by a material containing at least one of (A) to (D) below.

(A) is a metal containing Si, Cr, Mo, W, Ta, Ni, Ti, or an alloy containing at least two of these elements; (B) is a metal oxide of at least one element selected from the group consisting of Si, Cr, Mo, W, Ta, Ni, and Ti; (C) is a metal nitride of at least one element selected from the group consisting of Si, Cr, Mo, W, Ta, Ni, and Ti; and (D) is a metal carbide of at least one element selected from the group consisting of Si, Cr, Mo, W, Ta, Ni, and Ti.

[8] An optical element manufactured by nanoimprinting and injection molding using the mold for manufacturing an optical element described in any one of [1] to [4].

Advantageous Effects of Invention

According to the mold for manufacturing an optical element and the method for producing the same of the present invention, an optical element that can reduce directionality of diffracted light can be easily manufactured despite recesses and protrusions having a fine pitch being provided such that diffracted light is produced, and the pitch of recesses and protrusions can be adjusted.

According to the optical element of the present invention, directionality of diffracted light can be reduced.

DESCRIPTION OF EMBODIMENTS

First Embodiment

<Mold for Manufacturing Optical Element>

An embodiment of a mold for manufacturing an optical element of the present invention (hereinafter abbreviated as "mold") is described.

Figure 1:
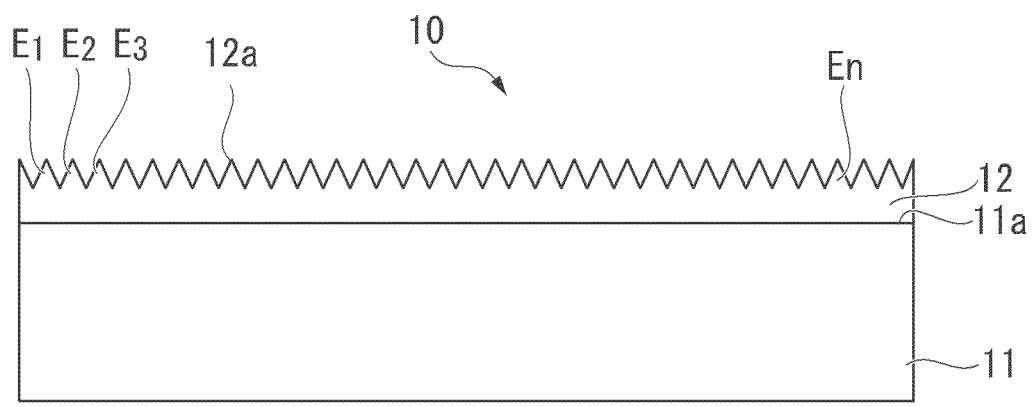
FIG. 1 is a cross-sectional view schematically illustrating a first embodiment of the mold for manufacturing an optical element of the present invention.

FIG. 1 illustrates the mold of this embodiment. The mold 10 of this embodiment has a base material 11 of which the surface 11a is made of a planar sheet-like body, and a recessing and protruding layer 12 provided on the surface 11a of the base material 11.

The size of the mold is selected as appropriate according to the optical element to be manufactured by the mold. For example, when the optical element is a diffraction grating used in an organic EL or thin-film device, the area of the surface 11a of the base material 11 is from 30 mm×30 mm to 1100 mm×1300 mm, and preferably from 200 mm×200 mm to 400 mm×500 mm.

(Base Material)

As the material of the base material 11, for example, iron, stainless steel, nickel, aluminum, chromium, copper, molybdenum, cobalt, tungsten, titanium, tungsten carbide, cermet, and the like may be used without particular limitation. The area of the surface 11a of the base material 11 is selected as appropriate according to the area of the optical element to be manufactured by the mold. The thickness of the base material 11 is not particularly limited provided that strength as a mold 10 can be maintained, but it may be, for example, from 0.1 mm to 100 mm, and preferably from 0.3 mm to 10 mm.

The shape of the base material 11 is a flat body. The surface roughness (Ra) of the surface 11a is from 0.1 nm to 50 nm, and preferably from 0.1 nm to 10 nm. The recessing and protruding layer 12 is formed on the surface 11a.

(Recessing and Protruding Layer)

The recessing and protruding layer 12 is a layer of which the face that abuts the material of the optical element is a recessing and protruding face 12a. In this embodiment, there are a plurality of conical protrusions $E_n$ (n is a positive number not less than 1).

From the perspective of high hardness and excellent film deposition characteristics, it is preferred that the recessing and protruding layer 12 be formed by a material containing at least one of (A) to (D) below.

(A) is a metal containing Si, Cr, Mo, W, Ta, Ni, Ti, or an alloy containing at least two thereof. Such an alloy includes, for example, Cr—Mo, Cr—W, Ni—Mo, Ni—W, Ni—Ti, Ni—Cr, Ni—Cr—Mo, Ti—Ta, Ti—W, W—Mo, and the like.

(B) is a metal oxide of at least one element selected from the group consisting of Si, Cr, Mo, W, Ta, Ni, and Ti. Such a metal oxide includes $SiO_2$, $Cr_2O_3$, $MoO_3$, $WO_3$, $Ta_2O_5$, NiO, $TiO_2$, and the like.

(C) is a metal nitride of at least one element selected from the group consisting of Si, Cr, Mo, W, Ta, Ni, and Ti. Such a metal nitride includes, for example, SiN, TiN, CrN, TaN(Ti, Cr)N, WN, and the like.

(D) is a metal carbide of at least one element selected from the group consisting of Si, Cr, Mo, W, Ta, Ni, and Ti. Such a metal carbide includes, for example, SiC, WC, TiC, $Cr_3C_2$, and the like.

Among these, Cr, Mo, W, Ti, Ta, $SiO_2$, $TiO_2$, SiN, TiN, SiC, and WC are preferred due to the fact that film deposition is easier.

The recessing and protruding layer 12 is preferably formed by a material containing (A1) and at least one of (B) to (D) below.

(A1) is a metal containing Si, Cr, Mo, W, Ta, Ti, or an alloy containing at least two of Si, Cr, Mo, W, Ta, Ni, and Ti. Such an alloy includes, for example, Cr—Mo, Cr—W, Ni—Mo, Ni—W, Ni—Ti, Ni—Cr, Ni—Cr—Mo, Ti—Ta, Ti—W, W—Mo, and the like.

(B) is a metal oxide of at least one element selected from the group consisting of Si, Cr, Mo, W, Ta, Ni, and Ti. Such a metal oxide includes $SiO_2$, $Cr_2O_3$, $MoO_3$, $WO_3$, $Ta_2O_5$, NiO, $TiO_2$, and the like.

(C) is a metal nitride of at least one element selected from the group consisting of Si, Cr, Mo, W, Ta, Ni, and Ti. Such a metal nitride includes, for example, SiN, TiN, CrN, TaN(Ti, Cr)N, WN, and the like.

(D) is a metal carbide of at least one element selected from the group consisting of Si, Cr, Mo, W, Ta, Ni, and Ti. Such a metal carbide includes, for example, SiC, WC, TiC, $Cr_3C_2$, and the like.

Among these, Cr, Mo, W, Ti, Ta, $SiO_2$, $TiO_2$, SiN, TiN, SiC, and WC are preferred due to the fact that film deposition is easier. Furthermore, from the prospective of etching speed with respect to etching gas used in an etching step to be described later, Cr, W, SiN, TiN, and SiC are preferred.

The combination of the material of the base material 11 and the material of the recessing and protruding layer 12 may be determined in consideration of adhesion during film deposition of the recessing and protruding layer 12 on the base material 11, strength, and the like. For example, when stainless steel is used as the base material 11, the recessing and protruding layer 12 preferably contains Ti, Cr, W, Ni.

A modal pitch, modal height, and shape of the fine recesses and protrusions are determined according to the application of the optical element. For example, when producing an antireflective body using the mold, the modal pitch of the fine recesses and protrusions is preferably adjusted according to the wavelength of light to be used. In this case, because visible light of wavelength from approximately 400 nm to 750 nm is used, the pitch of the recesses and protrusions is preferably from not less than 50 nm to not greater than 300 nm. Additionally, when the pitch of fine recesses and protrusions is from not less than 50 nm to not greater than 150 nm, diffracted light in the visible light region can be reduced. When the infrared region having a wavelength of from approximately 750 nm and not greater than 10,000 nm is used, the recesses and protrusions having a modal pitch of not less than 500 nm and not greater than 5,000 nm is preferred.

The modal pitch P of the protrusions $E_n$ on the recessing and protruding face is specifically determined as follows.

First, in a randomly chosen region on the recessing and protruding face 12a, an atomic force microscope (AFM) image is obtained for a square region whose edge length is from 30 to 40 times the modal pitch P. For example, when the modal pitch is approximately 300 nm, an image of a region of 9 μm×9 μm to 12 μm×12 μm is obtained. Then, waveform separation of the image is performed by Fourier transform, and a fast Fourier transform (FFT) image is obtained. Next, the distance from the zero-order peak to the first-order peak in the profile of the FFT image is determined. The reciprocal of the distance thus determined is the modal pitch P in that region. This process is performed in the same manner for not less than a total of 25 randomly chosen regions of the same area, and the modal pitch in each region is determined. The average of the modal pitches $P_1$ to $P_{25}$ of the not less than 25 regions obtained in this manner is the modal pitch P. Note that, at this time, regions that are at least 1 mm apart, and more preferably from 5 mm to 1 cm apart from each other are preferably chosen.

The optimal aspect ratio of the fine recesses and protrusions is determined depending on the application of the optical element. For example, when producing a diffraction grating used in an organic EL or thin-film device using this mold, the aspect ratio of the protrusions $E_n$ in the recesses and protrusions is preferably from 0.1 to 1.0. For example, when producing an antireflective body using this mold, the aspect ratio of the protrusions $E_n$ in the recesses and protrusions is preferably from 0.5 to 4.0, and more preferably from 1.0 to 3.0.

Here, the aspect ratio is the value determined by modal height H/modal pitch P.

The modal height H is specifically determined as follows.

Figure 2:
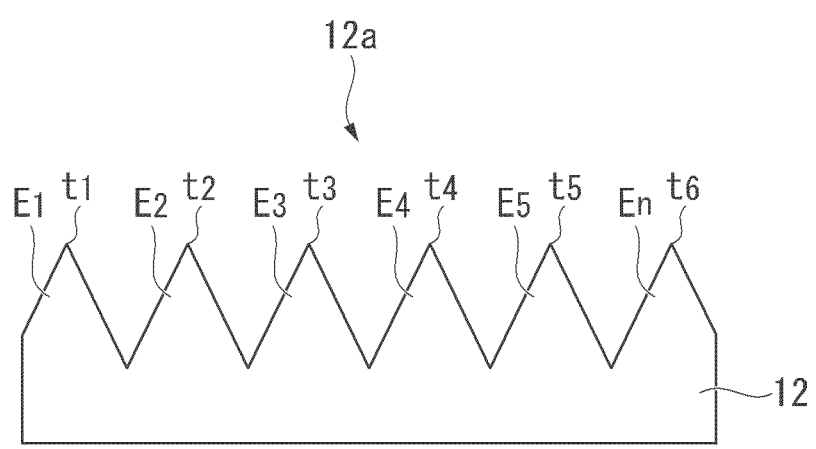
FIG. 2 is an enlarged cross-sectional view illustrating a recessing and protruding layer that constitutes the mold for manufacturing an optical element of FIG. 1.

First, a cross-section perpendicular to the substrate passing through the vertices of the protrusions $E_n$ along a line having a length of 1 mm in any direction at any position, i.e., the cross-section of FIG. 2, is obtained from an AFM image. Any portion of this cross-section containing not less than 30 protrusions $E_n$ is extracted, and for each of the protrusions $E_n$ contained therein, the difference between the height of its vertex and the height of the lowest position on a flat portion located between that protrusion $E_n$ and an adjacent $E_n$ is determined, the obtained value is rounded to the most significant two digits, and taking this as the height of each protrusion $E_n$, the mode thereof is taken as the modal height H.

When producing a diffraction grating used in an organic EL or thin-film device using this mold, the modal height H of the protrusions is preferably from 10 nm to 500 nm, and more preferably from 15 nm to 150 nm. When the modal height H is within the preferred range, an effect of improving the light extraction efficiency of the organic EL or thin-film device is obtained. When producing an antireflective body targeted for visible light using this mold, the modal height H of the protrusions is preferably from 25 nm to 1200 nm, and more preferably from 120 nm to 500 nm. When producing an antireflective body targeted for infrared light using this mold, the modal height H of the protrusions is preferably from 250 nm to 10,000 nm, and more preferably from 750 nm to 10,000 nm. When the modal height H is within the preferred range, an effect of improving antireflective performance can be obtained.

Figure 3:
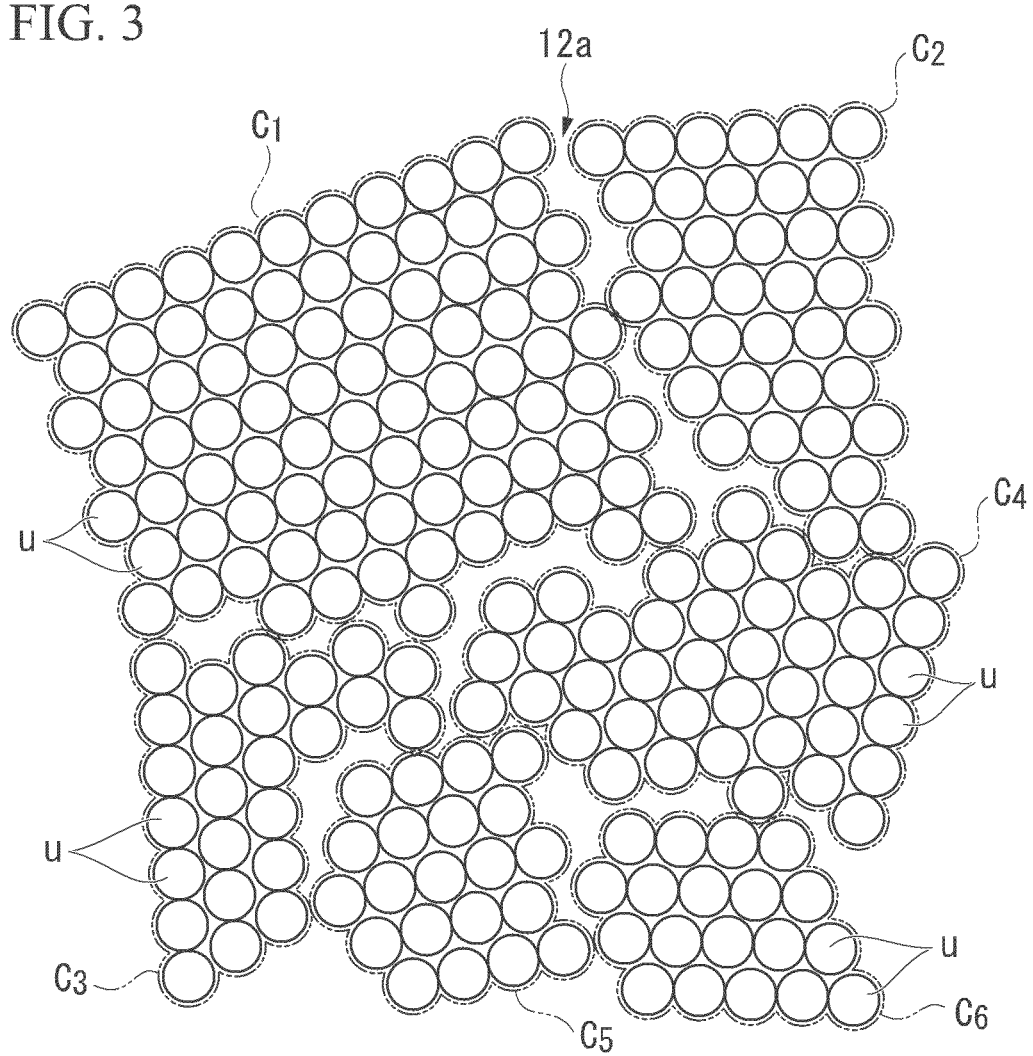
FIG. 3 is an enlarged plan view illustrating the recessing and protruding layer that constitutes the mold for manufacturing an optical element of FIG. 1.

The recessing and protruding face 12a of the recessing and protruding layer 12 has a plurality of areas $C_1$ to $C_n$, as illustrated in FIG. 3. The areas $C_1$ to $C_n$ are regions continuously arranged in a positional relationship in which the central point of seven adjacent protrusions is an intersection point of diagonal lines of six vertices of a regular hexagon. Note that in FIG. 3, for convenience, the position of the central point of each protrusion is indicated by a circle u centered on that central point.

A positional relationship in which the central point of seven adjacent protrusions is an intersection point of diagonal lines of six vertices of a regular hexagon is, specifically, a relationship that satisfies the following conditions.

First, a line segment L1 of a length equal to the modal pitch P is drawn from one central point t1 (refer to FIG. 2) toward an adjacent central point t2. Then, line segments L2 to L6 of lengths equal to the modal pitch P are drawn from the central point t1 in directions 60°, 120°, 180°, 240°, and 300° with respect to the line segment L1. When each of six central points adjacent to central point t1 is within a range of 15% of the modal pitch P from the end point of each line segment L1 to L6 on the side opposite the central point t1, the central point of these seven protrusions is in a positional relationship so that the central point is an intersection point of diagonal lines of six vertices of a regular hexagon.

The modal area Q of the areas $C_1$ to $C_n$ (the mode of the area size) is preferably in the following range.

When the modal pitch P is less than 500 nm, the modal area Q within a 10 mm×10 mm AFM image measurement range is preferably from 0.026 µm² to 6.5 mm².

When the modal pitch P is from not less than 500 nm to less than 1 µm, the modal area Q within a 10 mm×10 mm AFM image measurement range is preferably from 0.65 µm² to 26 mm².

When the modal pitch P is not less than 1 µm, the modal area Q within a 50 mm×50 mm AFM image measurement range is preferably from 2.6 µm² to 650 mm².

When the modal area Q is within the preferred range, it is easier to suppress the color shift of the light.

Furthermore, the areas $C_1$ to $C_n$ have random areas, shapes, and crystal orientations (orientation of a hexagonal lattice created by the particle arrangement), as illustrated in FIG. 3. Here, the lattice orientation of the areas $C_1$ to $C_n$ signifies the direction of a primitive translation vector (of which two exist in the case of a triangular lattice) obtained by connecting the vertices of adjacent protrusions in the same area when viewed from the top face of the substrate. Due to the fact that the area, shape, and crystal orientation of each of the areas $C_1$ to $C_n$ are random, diffracted light can be equalized and directionality can be reduced, and, when the article obtained from this mold is an antireflective body, color shifting can be suppressed. Also, when the article obtained from this mold is a grating structure used in an organic EL device or the like, anisotropy of the grating effect can be reduced.

Specifically, the degree of randomness of area preferably satisfies the following conditions.

First, an ellipse of the maximum area circumscribed by the boundary line of one area is drawn, and that ellipse is represented by formula (α) below:

$$X^2/a^2 + Y^2/b^2 = 1. \quad (\alpha)$$

When the modal pitch P is less than 500 nm, the standard deviation of πab within a 10 mm×10 mm AFM image measurement range is preferably not less than 0.08 µm².

When the modal pitch P is from not less than 500 nm to less than 1,000 nm, the standard deviation of πab within a 10 mm×10 mm AFM image measurement range is preferably not less than 1.95 µm².

When the modal pitch P is not less than 1,000 nm, the standard deviation of πab within a 50 mm×50 mm AFM image measurement range is preferably not less than 8.58 µm².

When the standard deviation of πab is within the preferred range, the effect of equalizing diffracted light is excellent.

As for the degree of randomness of shape of the areas $C_1$ to $C_n$, specifically, the standard deviation of the ratio of a to b(a/b) in the above formula (α) is preferably not less than 0.1.

Specifically, the randomness of the crystal orientation of the areas $C_1$ to $C_n$ preferably satisfies the following conditions.

First, a straight line K0 is drawn connecting the central points of any two adjacent protrusions in any area (I). Then, one area (II) adjacent to the area (I) is chosen, and six straight lines K1 to K6 are drawn connecting any protrusion in area (II) and the central points of six protrusions adjacent to that protrusion. When all of lines K1 to K6 are at an angle of not less than 3 degrees with respect to the straight line K0, it is defined that the crystal orientations of area (I) and area (II) are different.

Among areas adjacent to area (I), there are preferably not less than two areas having a different crystal orientation than area (I), and more preferably not less than three such areas, and even more preferably not less than five such areas.

(Functions and Effects)

The recesses and protrusions of the recessing and protruding layer 12 that constitutes the above mold for manufacturing an optical element 10 are random to an appropriate degree. Accordingly, directionality of diffracted light can be reduced and color shifting can be suppressed despite recesses and protrusions having a fine pitch being provided such that diffracted light is produced.

Furthermore, the recesses and protrusions of the recessing and protruding layer 12 are not completely random, and have a certain order within the range of each of the areas $C_1$ to $C_n$. Accordingly, the pitch of the recesses and protrusions can be easily adjusted, and the targeted optical function can be easily obtained.

<Method for Producing Mold>

An embodiment of a method for producing the above mold 10 will be described.

The production method of this embodiment has a film deposition step, a particle arrangement step, and an etching step.

(Film Deposition Step)

The film deposition step is a step in which an inorganic film which will subsequently become the recessing and protruding layer 12 is deposited on the surface 11a of the base material 11.

The film deposition method of the inorganic film in the film deposition step may be any of physical vapor deposition (PVD) such as sputtering or vacuum deposition, chemical vapor deposition (CVD), or plating (electrolytic, electroless), but sputtering is preferred from the perspective of film deposition characteristics. As structural features, an inorganic film formed by sputtering has the feature of strong adhesive strength with respect to the base material compared to those formed by CVD or plating. An inorganic film formed by CVD has the feature of good film crystallinity compared to those formed by sputtering or plating. An inorganic film formed by plating has the feature of being able to form dense layers compared to those formed by sputtering or CVD.

A method for depositing an inorganic film by sputtering that can be applied is a method wherein an inert gas such as argon gas is made to collide with a target of the same components as the recessing and protruding layer 12 formed by the production method, thereby accumulating atoms flying from the target on the surface 11a.

When forming the recessing and protruding layer 12 by an oxide of the aforementioned (B) or a nitride of the aforementioned (C), sputtering is performed so that inert gas is made to collide with a target containing at least one element selected from the group consisting of Si, Cr, Mo, W, Ta, Ni, and Ti in an atmosphere containing at least one of oxygen and nitrogen, thereby allowing that element, which flies from the target, and at least one of the oxygen and nitrogen in the atmosphere to be accumulated on the surface 11a.

When forming the recessing and protruding layer 12 by an oxide of the above (B1) or a nitride of the above (C1), sputtering is performed so that inert gas is made to collide with a target containing at least one element selected from the group consisting of Si, Cr, Mo, W, Ta, and Ti in an atmosphere containing at least one of oxygen and nitrogen, thereby allowing that element, which flies from the target, and at least one of the oxygen and nitrogen in the atmosphere to be accumulated on the surface 11a.

In this case, the oxygen atom content in the inorganic film can be adjusted according to the concentration of oxygen in the atmosphere. Furthermore, the nitrogen atom content in the inorganic film can be adjusted according to the concentration of nitrogen in the atmosphere.

A known method of sputtering may be used without particular limitation, but magnetron sputtering is preferred due to its excellent film deposition characteristics.

The sputtering conditions are not particularly limited, but normally, the temperature is from 25.0° C. to 250° C., and the absolute pressure is from 0.1 Pa to 3.0 Pa.

Furthermore, in sputtering, the sputtering time is adjusted such that the thickness of the inorganic film is from 0.1 μm to 10.0 μm.

(Particle Arrangement Step)

The particle arrangement step is a step in which a plurality of particles is arranged in a monolayer on a surface of the inorganic film obtained in the film deposition step.

The particle arrangement step in this embodiment is performed by a method that employs the concept of the Langmuir-Blodgett (LB) method. Specifically, the particle arrangement step in this embodiment, wherein a single-particle film is disposed on an inorganic film as a mask, has a dripping step, a single-particle film formation step, a transfer step, and, as necessary, an affixation step.

The dripping step is a step in which a dispersion having particles dispersed in a solvent of lower specific gravity than water is dripped on the surface of water in a water tank.

The single-particle film formation step is a step in which a single-particle film made of the above particles is formed on the surface of water by volatilizing the solvent.

The transfer step is a step in which the above single-particle film is transferred to the inorganic film.

The affixation step is a step in which the transferred single-particle film is affixed to the inorganic film.

Hereinafter, each process is specifically described.

[Dripping Step and Single-Particle Film Formation Step]

First, a dispersion is prepared by adding particles M to a solvent of lower specific gravity than water. Meanwhile, a water tank (trough) is prepared, and water for expanding the particles M on the surface thereof (hereinafter sometimes referred to as "lower-layer water") is put in the tank.

The surface of the particles M is preferably hydrophobic. It is also preferable to select a hydrophobic solvent. By combining the hydrophobic particles M and solvent with the lower-layer water, self-assembly of the particles M progresses, as will be described later, and a two-dimensionally close-packed single-particle film is formed.

The material of the particles M is at least one type of particle selected from the group consisting of organic particles, organic-inorganic composite particles, and inorganic particles. The material that forms the organic particles is at least one type selected from the group consisting of thermoplastic resins such as polystyrene or PMMA, thermosetting resins such as phenol resins or epoxy resins, diamond, graphite, and fullerenes. The material that forms the organic-inorganic composite particles is at least one type selected from the group consisting of, for example, SiC and boron carbide.

Among these, the material of the particles M is preferably inorganic particles. The material that forms the inorganic particles is at least one type selected from the group consisting of, for example, inorganic oxides, inorganic nitrides, inorganic borides, inorganic sulfides, inorganic selenides, metal compounds, and metals.

The inorganic oxide is at least one type selected from the group consisting of, for example, silica, alumina, zirconia, titania, ceria, zinc oxide, tin oxide, and yttrium aluminum garnet (YAG). The inorganic nitride is at least one type selected from the group consisting of, for example, silicon nitride, aluminum nitride, and boron nitride. The inorganic boride is at least one type selected from the group consisting of, for example, $ZrB_2$ and $CrB_2$. The inorganic sulfide is at least one type selected from the group consisting of, for example, zinc sulfide, calcium sulfide, cadmium sulfide, and strontium sulfide. The inorganic selenide is at least one type selected from the group consisting of, for example, zinc selenide and cadmium selenide. The metal particles are at least one type of particle selected from the group consisting of Si, Ni, W, Ta, Cr, Ti, Mg, Ca, Al, Au, Ag, and Zn.

Furthermore, in the material that forms the particles M, some of the constituent elements may be substituted with another different element. For example, the material that forms the particles M may be a sialon, constituted of silicon, aluminum, oxygen, and nitrogen. Furthermore, the particles M may be a mixture of particles of not less than two different materials. Also, the particles M may be a laminate made of different materials, e.g., particles obtained by coating inorganic particles made of an inorganic nitride with an inorganic oxide. Furthermore, the particles M may be fluorescent particles in which an activator such as cerium or europium has been introduced into an inorganic particle. Among the above materials, the material that forms the particles M is preferably an inorganic oxide due to the fact that the shape of the particles M is stable, and among inorganic oxides, silica, titania, alumina, and zirconia are more preferred.

It is important that the solvent have high volatility. Hydrophobic solvents that have high volatility include volatile organic solvents made of not less than one type selected from chloroform, methanol, ethanol, isopropanol, acetone, methyl ethyl ketone, ethyl ethyl ketone, methyl isobutyl ketone, toluene, hexane, cyclohexane, ethyl acetate, butyl acetate, and the like.

When the particles M are inorganic particles, it is normally preferred that they be used after being hydrophobized using a hydrophobizing agent because the surface thereof is hydrophilic. As the hydrophobizing agent, surfactants, metal alkoxysilane, and the like may be used.

Hydrophobizing of the particles M may be performed using a surfactant, metal alkoxysilane, or the like similar to the hydrophobizing agent described in Japanese Unexamined Patent Application Publication No. 2009-162831A, by a similar method.

To further increase the precision of the formed single-particle film, it is preferable to pass the dispersion through a microfilter such as a membrane filter to remove aggregated particles (secondary particles made of a plurality of primary particles) present in the dispersion before it is dripped onto the liquid surface. When this microfiltration is performed beforehand, locations partially having two or more layers and defect locations having no particles tend not to form, and a high-precision single-particle film is readily obtained. Supposing there are large defects on the order of several microns to several tens of microns in the formed single-particle film, such defects are not detected as differences in surface pressure in the transfer step to be described in detail later, even when an LB trough device equipped with a surface pressure sensor for measuring the surface pressure of the single-particle film and a movable barrier for compressing the single-particle film in the liquid surface direction are used, and a high-precision single-particle film is difficult to obtain.

The dispersion described above is dripped onto the surface of the lower-layer water (dripping step). By so doing, the solvent that is the dispersion medium volatilizes and the particles M expand in a monolayer on the surface of the lower-layer water, and a two-dimensionally close-packed single-particle film can be formed (single-particle film formation step).

The particle concentration of the dispersion dripped onto the lower-layer water is preferably from 1% by mass to 10% by mass with respect to the total dispersion. The dripping rate is preferably from 0.001 mL/s to 0.01 mL/s. When the concentration of the particles M in the dispersion and the dripped amount are in such ranges, the tendency of the particles to partially aggregate into clusters and result in two or more layers, the tendency for defect locations where no particles exist to occur, and the tendency for the pitch between particles to widen are suppressed, and a single-particle film in which the particles are two-dimensionally close-packed is readily obtained.

In the single-particle film formation step, the single-particle film is formed by self-assembly of the particles M. The principle behind this is that when particles accumulate, surface tension caused by the dispersion medium present between particles acts, and as a result, the particles M automatically form a two-dimensionally close-packed structure rather than existing randomly. As another expression, this close packing due to such surface tension is also called ordering by lateral capillary forces.

Figure 4:
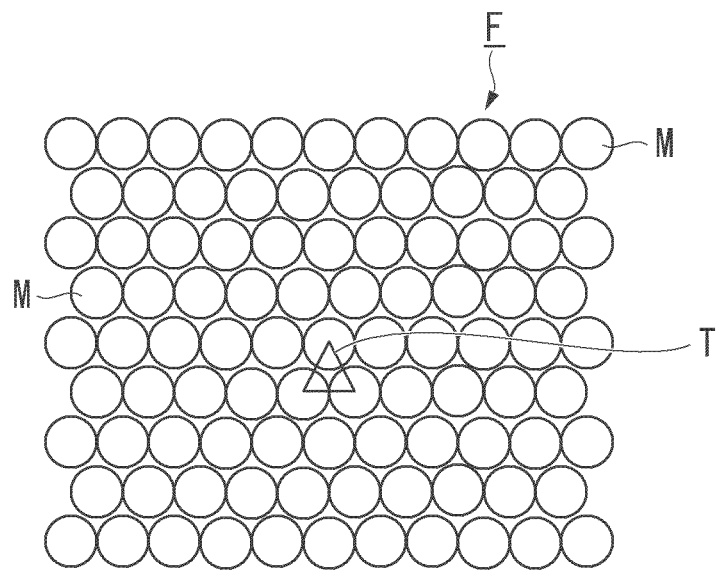
FIG. 4 is a plan view schematically illustrating particles arranged in a single-particle film formation step.

In particular, when three particles M that are spherical and have high uniformity of particle size, like colloidal silica, for example, collect and come into contact with each other while floating on a water surface, surface tension acts so as to minimize the total length of the waterline of the particles, and, as illustrated in FIG. 4, the three particles M stabilize in an arrangement based on a regular triangle indicated by T in the diagram.

The single-particle film formation step is preferably performed under ultrasonic irradiation conditions. When the solvent of the dispersion is volatilized while irradiating the water surface with ultrasonic waves from the lower-layer water, close packing of the particles M is promoted, and a single-particle film in which the particles M are two-dimensionally close-packed with higher precision is obtained. At this time, the power of the ultrasonic waves is preferably from 1 W to 1,200 W, and more preferably from 50 W to 600 W.

The frequency of the ultrasonic waves is not particularly limited, but is preferably, for example, from 28 kHz to 5 MHz, and more preferably from 700 kHz to 2 MHz. When the frequency is too high, it is undesirable because the water molecules start to absorb energy and the phenomenon of water vapor or droplets rising from the water surface occurs. Meanwhile, when the frequency is too low, the cavitation radius in the lower-layer water becomes large, and bubbles are produced in the water and float up toward the surface. When such bubbles accumulate below the single-particle film, it is problematic because the water surface is no longer flat.

A standing wave is generated at the water surface by ultrasonic irradiation. Attention is required because, no matter what the frequency, when the power is too high and the wave height on the water surface becomes too high depending on the tuning conditions of the ultrasonic transducer and the transmitter, the single-particle film will be broken by the surface wave.

When the ultrasonic frequency and power are appropriately set while heeding the above precautions, close packing of particles can be effectively promoted without the emerging single-particle film being broken. To perform effective ultrasonic irradiation, the characteristic frequency calculated from the size of the particles can be used as a benchmark. However, when the particle size is small, for example, not greater than 100 nm, the characteristic frequency ends up being extremely high, and it is therefore difficult to provide the calculated ultrasonic vibration. In such cases, when the calculation is performed assuming characteristic vibration corresponding to a mass ranging from a dimer to a 20-mer, the required frequency can be reduced to a practical range. A particle packing efficiency improving effect also occurs even when ultrasonic vibration corresponding to the characteristic frequency of an assembly of particles is provided. The ultrasonic irradiation time may be any duration provided that it is sufficient for particle rearrangement to be completed, and the required time varies depending on particle size, ultrasonic frequency, water temperature, and the like. However, under normal production conditions, from 10 seconds to 60 min is preferred, and from 3 min to 30 min is more preferred.

The advantages gained by ultrasonic irradiation are close packing of particles (hexagonal close packing of random arrangement), as well as an effect of destroying soft aggregates of particles readily generated during preparation of the nanoparticle dispersion, and an effect of repairing point defects, line defects, or crystal dislocations (local distortions of unit lattice occurring due to disturbance of particle arrangement) to a certain degree once they have occurred.

In the single-particle film formation step, it is preferable to arrange a plurality of particles M in a monolayer such that divergence D (%) of the arrangement defined by formula (1) below is not greater than 15%.

$$D[\%]=|A-B|\times 100/A \qquad (1)$$

Where, A is the average particle size of the particles M, and B is the modal pitch between the particles M. Also, |B−A| indicates the absolute value of the difference between A and B.

Divergence D is more preferably not greater than 10%, and even more preferably from 1.0% to 3.0%.

Here, the average particle size A of the particles M is the average primary particle size of the particles M that constitute the single-particle film, which can be determined by a commonly used method from the peak obtained by fitting the particle size distribution determined by particle dynamic light scattering to a Gaussian curve.

Meanwhile, the pitch between the particles M is the distance from vertex to vertex of two adjacent particles M, and the modal pitch B is the modal value thereof. Note that when the particles M are spherical and abut without a gap, the distance from vertex to vertex of adjacent particles M is equal to the distance from center to center of adjacent particles M.

Specifically, the modal pitch B between the particles M is determined as follows.

First, in a randomly chosen region on the single-particle film, an atomic force microscope image is obtained for a square region whose edge length is from 30 to 40 times the modal pitch B between the particles M. For example, in the case of a single-particle film that uses 300-nm particles M, an image of a region from 9 μm×9 μm to 12 μm×12 μm is obtained. Then, waveform separation of the image is performed by Fourier transform, and a fast Fourier transform (FFT) image is obtained. Next, the distance from the zero-order peak to the first-order peak in the profile of the FFT image is determined. The determined reciprocal is the modal pitch $B_1$ in that region. This process is performed in the same manner for not less than a total of 25 randomly chosen regions of the same area, and the modal pitches $B_1$ to $B_{25}$ of the regions are determined. The average of the modal pitches $B_1$ to $B_{25}$ of the not less than 25 regions obtained in this manner is the modal pitch B. Furthermore, at this time, regions that are at least 1 mm apart, and more preferably from 5 mm to 1 cm apart from each other are preferably chosen.

Furthermore, at this time, variations in pitches between the particles M in each image can be evaluated from the area of the primary peak in the FFT image profile.

The divergence D of this arrangement is an indicator of the degree of close packing of the particles M. That is, a low divergence D of particle arrangement means that the degree of close packing is high, the gaps between particles are controlled, and the precision of their arrangement is high.

To ensure the divergence D (%) of the arrangement is not greater than 15%, the coefficient of variation of particle size of the particles M (value obtained by dividing the standard deviation by the average) is preferably from 0.1% to 20%, more preferably from 0.1% to 10%, and even more preferably from 0.1% to 5.0%.

The modal pitch between the particles M is equal to the modal pitch of the recesses and protrusions of the recessing and protruding layer. Because the arrangement of the particles M has a high degree of close packing, the average particle size A of the particles M are appropriately selected, so that the modal pitch between particles can be adjusted and the modal pitch of the recesses and protrusions can be adjusted.

[Transfer Step]

The single-particle film that has been formed on a liquid surface in the single-particle film formation step is then transferred to the inorganic film in the single-layer state as-is (transfer step).

The specific method for transferring the single-particle film to the inorganic film is not particularly limited, and examples thereof include a method wherein the surface of the inorganic film provided on the base material is lowered from above and put in contact with the single-particle film while being held substantially perpendicular to the single-particle film, and the single-article film is transferred to the inorganic film by the affinity force between the hydrophobic single-particle film and the inorganic film; and a method wherein the inorganic film provided on the base material is disposed in a substantially perpendicular direction in the lower-layer water in a water tank prior to forming the single-particle film, and after the single-particle film is formed on the liquid surface, the single-particle film is transferred to the inorganic film by gradually lowering the liquid level.

The single-particle film can be transferred to the inorganic film without using special equipment by either of the above methods, but the so-called LB trough method is preferably employed in the subsequent step because even if the single-particle film has a larger area, it is easily transferred to the inorganic film while maintaining its two-dimensionally close-packed state (refer to Journal of Materials and Chemistry, Vol. 11, 3333 (2001), Journal of Materials and Chemistry, Vol. 12, 3268 (2002), and the like).

Figure 5A:
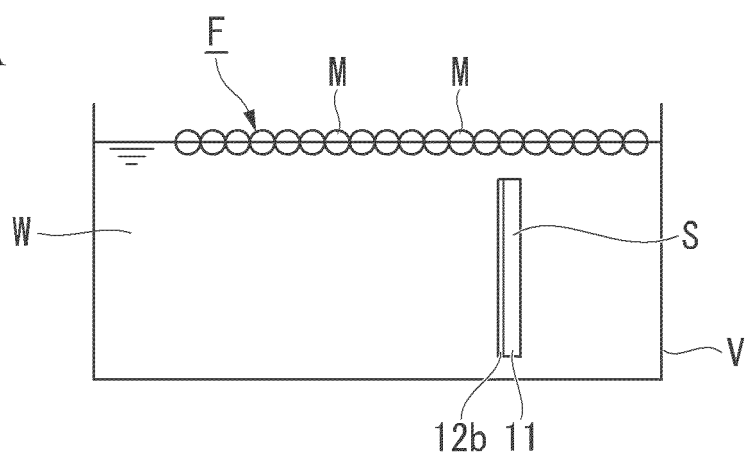
FIG. 5A is an explanatory diagram illustrating a state before the start of a transfer step in a particle arrangement step using the Langmuir-Blodgett (LB) method.
Figure 5B:
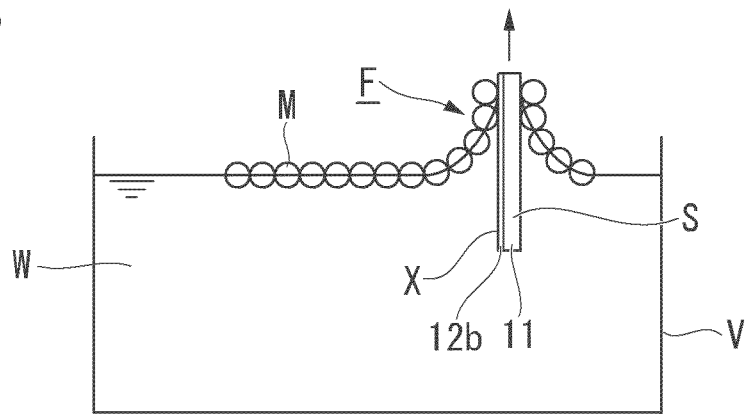
FIG. 5B is an explanatory diagram illustrating a state during the transfer step in the particle arrangement step using the LB method.

FIGS. 5A and 5B schematically illustrate an outline of the LB trough method. Note that, in FIGS. 5A and 5B, the particles M are greatly enlarged for the sake of convenience.

In this method, a workpiece S, in which an inorganic film 12b is provided on the base material 11, is immersed in advance in lower-layer water W in water tank V such that the surface of the inorganic film 12b is substantially vertical, and in that state, the above dripping step and single-particle film formation step are performed, and a single-particle film F is formed (FIG. 5A). Then, after the single-particle film formation step, the workpiece S is raised upward while the surface of the inorganic film 12b remains vertical, so that the single-particle film F can be transferred to the surface of the inorganic film 12b (FIG. 5B).

Note that the figures illustrate the state where the single-particle film F is transferred to both side faces of the workpiece S, but the recessing and protruding structure may be formed only on one side face X of the workpiece S. It is preferred that the single-particle film F be transferred only to the side face X in a state where wrap-around of the particles M from the side face X to the rear face is prevented by shielding the face (rear face) on the side opposite the one side face X of the workpiece S with a thick plate so that the single-particle film F can be transferred more precisely. However, it is permissible if it is transferred to both faces.

Here, since the single-particle film F has already been formed into a monolayer on the liquid surface in the single-particle film formation step, there is no risk of the single-particle film F being destroyed so as to be multilayered in the transfer step even if the temperature conditions of the transfer step (temperature of lower-layer water) or the raising speed of the workpiece fluctuate somewhat. Note that the temperature of the lower-layer water is normally approximately from 10° C. to 30° C., depending on the ambient temperature which normally fluctuates depending on season and weather.

Furthermore, at this time, an LB trough device equipped with a surface pressure sensor (not illustrated) that uses the principle of a Wilhelmy plate or the like, which measures the surface pressure of the single-particle film F, and a moveable barrier (not illustrated), which compresses the single-particle film F in the direction along the liquid surface, is used as the water tank V, so that a single-particle film F of a larger area can be transferred to the inorganic film 12b more stably. By such a device, the single-particle film F can be compressed to a preferred diffusion pressure (density) while the surface pressure of the single-particle film F is measured, and additionally, it can be moved at a constant speed toward the inorganic film 12b. Accordingly, transfer of the single-particle film F from the liquid surface to the inorganic film 12b proceeds smoothly; thus problems are less likely to occur such as of only a single-particle film F of small area being transferred. The diffusion pressure is preferably from 5 mNm$^{-1}$ to 80 mNm$^{-1}$, and more preferably from 10 mNm$^{-1}$ to 40 mNm$^{-1}$. When the diffusion pressure is in this range, a single-particle film F in which the particles are two-dimensionally close-packed with high precision is readily obtained. Furthermore, the speed at which the workpiece S is raised is preferably from 0.5 mm/min to 20 mm/min. As described previously, the temperature of the lower-layer water is normally from 10° C. to 30° C. Note that the LB trough device used can be a commercially available product.

It is preferable that the single-particle film F be transferred to the inorganic film 12b in the state in which the single-particle film F has the particles two-dimensionally close-packed with as high precision as possible in this manner, but no matter how carefully the operation is performed, 100% complete close packing is not achieved, and the particles transferred to the inorganic film 12b end up in a polycrystalline state. Here, a polycrystalline state means a state in which the lattice orientation of the particles M is uniform within each of the areas $C_{11}$ to $C_{1n}$, but it is not macroscopically uniform. Accordingly, through steps described below, it is possible to ultimately form, on the inorganic film 12b, a recessing and protruding structure having a plurality of areas continuously arranged in a positional relationship in which the central point of seven adjacent protrusions is an intersection point of diagonal lines of six vertices of a regular hexagon.

(Affixation Step)

The single-particle film F of the particles M can be transferred to the inorganic film 12b by the transfer step, but after the transfer step, an affixation step may be performed to affix the transferred single-particle film F to the inorganic film 12b. When the transfer step alone is performed, there is the possibility of the particles M moving on the inorganic film 12b during the etching step.

By performing the affixation step of affixing the single-particle film on the inorganic film 12b, the possibility of the particles M moving on the inorganic film 12b is reduced, and etching can be performed more stably and with higher precision.

Methods for the affixation step include a method in which binder is used and a sintering method.

In the method in which binder is used, a binder solution is supplied to the inorganic film 12b on which the single-particle film has been formed, and is made to penetrate between the inorganic film 12b and the particles M that constitute the single-particle film.

The amount of binder to be used is preferably from 0.001 to 0.02 times the mass of the single-particle film. If within such a range, the particles can be adequately affixed without the problem of excessive binder clogging the gaps between the particles M and adversely affecting the precision of the single-particle film. When a large amount of binder solution ends up being supplied, after the binder solution penetrates, the excess binder solution can be removed by using a spin coater or by tilting the workpiece.

Examples of the binder may include a metal alkoxysilane mentioned previously as a hydrophobizing agent, general organic binder, inorganic binder, and the like. After the binder solution penetrates, appropriate heat treatment may be performed in accordance with the type of binder. When a metal alkoxysilane is used as a binder, heat treatment is preferably performed for from 3 min to 60 min at from 40° C. to 80° C.

When a sintering method is employed, the inorganic film on which the single-particle film has been formed may be heated to fuse the particles M that constitute the single-particle film to the inorganic film. The heating temperature can be determined according to the material of the particles M and the material of the inorganic film, but with the particles M of particle size not greater than 1,000 nm, sintering is completed at a relatively low temperature because an interfacial reaction begins at a temperature lower than the original melting point of those substances. When the heating temperature is too high, the fusion area of the particles becomes large, resulting in the possibility of affecting precision, such as the shape of the single-particle film changing.

Furthermore, when heating is performed in air, there is the possibility of the inorganic film and the particles M oxidizing. Therefore, when employing the sintering method, it is preferable to set conditions in consideration of the possibility of such oxidation.

[Etching Step]

The etching step is a step in which the inorganic film is dry-etched using the plurality of particles M as an etching mask.

Figure 6A:
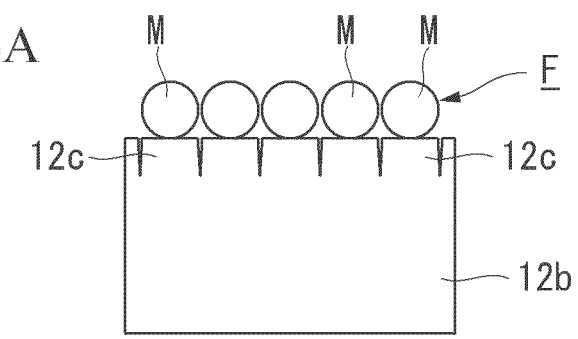
FIG. 6A is an explanatory diagram of a method of producing the mold for manufacturing an optical element of FIG. 1, illustrating a state after the particle arrangement step.
Figure 6B:
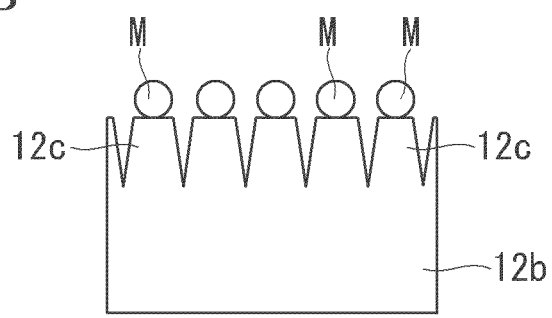
FIG. 6B is an explanatory diagram of the method of producing the mold for manufacturing an optical element of FIG. 1, illustrating a state during an etching step.
Figure 6C:
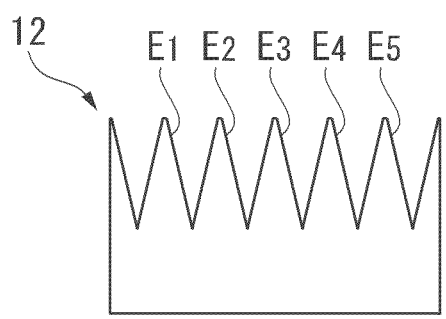
FIG. 6C is an explanatory diagram of the method for producing the mold for manufacturing an optical element of FIG. 1, illustrating a state after the etching step.

In the etching step, first, as illustrated in FIG. 6A, etching gas passes through the gaps between the particles M that constitute the single-particle film F and reaches the surface of the inorganic film 12b, so that grooves are formed in that portion, and round pillars 12c appear at the respective positions corresponding to the particles M. Then, as etching continues, the particles M on the round pillars 12c are gradually etched and become small, and at the same time, the grooves in the inorganic film 12b become deeper (FIG. 6B). Then, finally, the particles M disappear due to etching, and a plurality of conical protrusions $E_n$ are formed on one face of the inorganic film 12b (FIG. 6C).

Examples of the etching gas used in dry etching include Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_3$, HBr, $CBrF_3$, HCl, $CH_4$, $NH_3$, $O_2$, $H_2$, $N_2$, CO, $CO_2$, and the like, and one or more of these may be used in accordance with the material of the particles that constitute the single-particle film mask and the material of the inorganic film.

As the etching device for performing dry etching, a device capable of anisotropic etching, such as a reactive ion etching device, ion beam etching device, or the like, is used. Provided that it can generate a bias electric field of at least approximately 20 W, the etching device is not particularly limited in its specifications such as plasma generation mode, electrode structure, chamber structure, the frequency of a high-frequency power source, and the like.

Etching conditions may be selected as appropriate according to the aspect ratio of the recesses and protrusions to be obtained. Examples of etching conditions include bias power, antenna power, gas flow rate and pressure, etching time, and the like.

When the average pitch C of the arrangement of the recesses and protrusions obtained in this manner is determined by the same method as that used for determining the average pitch B between particles in the single-particle film etching mask described previously, this average pitch C is substantially the same value as the average pitch B of the used single-particle film etching mask. Furthermore, the average pitch C of the arrangement is equivalent to the average diameter d of the bottom of the recesses and protrusions. Additionally, when the divergence D' (%) of the arrangement defined by formula (2) below is determined for these fine recesses and protrusions, its value is also not greater than 10%.

$$D'[\%]=|C-A|\times 100/A \qquad (2)$$

Where, in formula (2), A is the average particle size of the particles that constitute the used single-particle film etching mask.

(Functions and Effects)

According to the method for producing a mold for manufacturing an optical element having the above film deposition step, particle arrangement step, and etching step, a mold in which recesses and protrusions having a plurality of areas of random area, shape, and crystal orientation are formed can be produced.

Furthermore, mold production can be simplified because the above production method is a method in which recesses and protrusions are directly formed on an inorganic film provided on the surface of a base material rather than a method in which recesses and protrusions are transferred by electroforming. Additionally, fine recesses and protrusions can be formed on the surface of a mold for injection molding as well, and it is also possible to produce a sheet-like optical element on which recesses and protrusions have been formed on both faces.

<Method for Producing Optical Element>

As the method for producing an optical element using the above mold, nanoimprinting, press molding, injection molding, electroforming, and the like may be used. When these methods are used, a shape transfer body (replica) in which a periodic grating structure is formed with high precision that is advantageous in achieving a viewing angle restriction function can be produced in high quantity with good reproducibility.

Among the above methods for manufacturing an optical element, nanoimprinting and injection molding are preferred due to being particularly suited to transfer of fine recesses and protrusions.

Specific examples of the method for manufacturing an optical element by nanoimprinting using the mold of the above embodiment include, for example, the following methods (a) to (c).

(a) A method having a step in which the recessing and protruding face 12a of the mold 10 is coated with an uncured active energy ray-curable resin, and a step in which the curable resin is irradiated with active energy rays to be cured, and then the cured coating film is peeled from the mold 10 (optical imprinting method). Here, active energy rays are normally ultraviolet rays or an electron beam, but in this specification they include visible light rays, X rays, an ion beam, and the like.

(b) A method having a step in which the recessing and protruding face 12a of the mold 10 is coated with an uncured liquid thermosetting resin or an uncured liquid inorganic material, and a step in which the liquid thermosetting resin or liquid inorganic material is heated to be cured, and then the cured coating film is peeled from the mold 10.

(c) A method having a step in which a sheet-like thermoplastic resin is put in contact with the recessing and protruding face 12a of the mold 10, a step in which the sheet-like thermoplastic resin is heated while being pressed against the recessing and protruding face 12a to be softened, followed by cooling the sheet-like thermoplastic resin, and a step in which the cooled sheet-like thermoplastic resin is peeled from the mold 10 (thermal imprinting method).

In the optical imprinting method of (a), an optical imprinting device equipped with, for example, pressing means for pressing the mold against the photocurable resin and irradiation means for irradiating the photocurable resin with active energy rays may be used.

A specific example of method (a) is described. First, the recessing and protruding face 12a of the sheet-like mold 10 is coated with uncured liquid active energy ray-curable resin to a thickness of from 0.5 µm to 20 µm, and preferably from 1.0 µm to 10 µm.

Then, the mold 10 coated with the curable resin passes through a pair of rollers so as to be pressed, and the curable resin is packed into the recesses and protrusions of the mold 10. After that, the active energy ray irradiation device radiates active energy rays at from 10 mJ to 5,000 mJ, and preferably from 100 mJ to 2,000 mJ, thereby crosslinking and/or curing the curable resin. Then, the cured active energy ray-curable resin is peeled from the mold 10 to produce an optical element.

In method (a), with the objective of providing releasability, a layer made of silicone resin, fluorine resin, or the like may be provided on the recessing and protruding face 12a of the mold 10 to a thickness of from 1 nm to 10 nm before the recessing and protruding face 12a is coated with the uncured active energy ray-curable resin.

Examples of the uncured active energy ray-curable resin include those containing one or more components selected from prepolymers such as an epoxy acrylate, an epoxidized oil acrylate, an urethane acrylate, an unsaturated polyester, a polyester acrylate, a polyether acrylate, a vinyl/acrylate, a polyene/acrylate, a silicon acrylate, a polybutadiene, and a polystyrene methyl methacrylate; and monomers such as an aliphatic acrylate, an alicyclic acrylate, an aromatic acrylate, a hydroxyl group-containing acrylate, an allyl group-containing acrylate, a glycidyl group-containing acrylate, a carboxy group-containing acrylate, and a halogen-containing acrylate. The uncured active energy ray-curable resin is preferably used after appropriate dilution with a solvent such as ethyl acetate, methyl ethyl ketone, toluene, or the like.

Furthermore, a fluorine resin, a silicone resin, and the like may also be added to the uncured active energy ray-curable resin.

When the uncured active energy ray-curable resin is cured by ultraviolet rays, it is preferable to add a photopolymerization initiator such as acetophenones or benzophenones to the uncured active energy ray-curable resin.

Additionally, at least one of a polyfunctional (meth) acrylate monomer and oligomer may also be added to the uncured active energy ray-curable resin with the objective of increasing hardness after curing. Furthermore, it may also contain reactive inorganic oxide particles and/or reactive organic particles.

The uncured active energy ray-curable resin after being applied is bonded with an adhesive base made of resin, glass, or the like and then is irradiated with active energy rays. Active energy rays may be radiated from either the adhesive base or the mold 10 having active energy ray permeability.

The sheet thickness of the cured active energy ray-curable resin is preferably from 0.1 µm to 100 µm. When the sheet thickness of the cured active energy ray-curable resin is not less than 0.1 µm, adequate strength can be assured, and when not greater than 100 µm, adequate flexibility can be assured.

In method (b), examples of the liquid thermosetting resin include uncured melamine resin, urethane resin, epoxy resin, and the like. The heating conditions can be determined as appropriate according to the characteristics of the liquid thermosetting resin. When an epoxy resin is used, it is preferable that the heating temperature be from 150° C. to 200° C. and the heating time be from 3 min to 10 min. Furthermore, examples of the liquid inorganic material include uncured silicon oxide-based sol-gel material, polydimethylsiloxane, polysilsesquioxane, and the like. The heating conditions can be determined as appropriate according to the characteristics of the liquid inorganic material. When a silicon oxide-based sol-gel material is used, it is preferable that the heating temperature be from 100° C. to 500° C. and the heating time be from 20 min to 60 min. Furthermore, when polysilsesquioxane is used, it is preferable that the heating temperature be from 100° C. to 200° C. and the heating time be from 10 min to 60 min.

In the thermal imprinting method of (c), a thermal imprinting device equipped with, for example, pressing means for pressing the mold against the thermoplastic resin and temperature control means for controlling the temperature of the thermoplastic resin may be used.

In method (c), examples of the thermoplastic resin include an acrylic resin, a polyolefin, a polyester, and the like.

The pressure when pressing the sheet-like thermoplastic resin into a molded article for a secondary step is preferably from 1 MPa to 100 MPa. When the pressure during pressing is not less than 1 MPa, the recesses and protrusions can be transferred with high precision, and when not greater than 100 MPa, excessive pressure can be prevented.

The heating conditions can be determined as appropriate according to the characteristics of the thermoplastic resin. It is preferable that the heating temperature be from 120° C. to 200° C. and the pressing time be from 1 min to 5 min.

The cooling temperature after heating is preferably below the glass transition temperature of the thermoplastic resin, because the recesses and protrusions are transferred with high precision.

Among methods (a) to (c), method (a) which uses active energy ray-curable resin is preferred because heating can be omitted and it is simple.

When producing an optical element by injection molding, the mold of the above embodiment is used as part of the mold for injection molding that forms a cavity. That is, the above mold is arranged on the inner face of the cavity.

Specifically, in a method for producing an optical element by injection molding, first, the thermoplastic resin is melted using an injection molder on which a mold for injection molding is mounted. Then, the melted thermoplastic resin is injected at high pressure into the cavity of the mold for injection molding, and then the mold for injection molding is cooled. The mold for injection molding is then opened, and the obtained optical element is removed.

As the thermoplastic resin molded by injection molding, the same thermoplastic resins as used in the above thermal imprinting method may be used.

Specific examples of optical elements that can be produced using the above mold include diffraction gratings used in organic EL and thin-film devices, antireflective bodies, and the like.

When the optical element formed by the above method is a diffraction grating, it has a light-emitting face having recesses and protrusions corresponding to the mold 10 at least on the face from which light is emitted to the outside.

As for applications, when the optical element is a diffraction grating, it may be used as a substrate of organic EL lighting and the like. When the optical element is an antireflective body, it may be used as a lens used in optical equipment or the full panel of an image display device.

That is, the modal pitch, modal height, and shape of the fine recesses and protrusions of the light-emitting face of the optical element formed by the above method are determined depending on the application of the optical element. When the optical element is an antireflective body, the modal pitch of the fine recesses and protrusions is preferably adjusted according to the wavelength of light incident on the antireflective body. For example, when visible light of wavelength from approximately 400 nm to 750 nm is used, the pitch of the recesses and protrusions is preferably from not less than 50 nm to not greater than 300 nm. Additionally, when the pitch of fine recesses and protrusions is from not less than 50 nm to not greater than 150 nm, diffracted light in the visible light region can be reduced. When a wavelength in the infrared region from approximately 750 nm to not greater than 10,000 nm is used, the modal pitch of the recesses and protrusions is preferably from not less than 500 nm to not greater than 5,000 nm.

The optimal aspect ratio of the fine recesses and protrusions is determined depending on the application of the optical element. For example, when the optical element produced by this mold is used as a diffraction grating used in an organic EL or thin-film device, the aspect ratio of the protrusions $E_n$ in the recesses and protrusions is preferably from 0.1 to 1.0. For example, when the optical element produced by this mold is used as an antireflective body, the aspect ratio of the protrusions $E_n$ in the recesses and protrusions is preferably from 0.5 to 4.0, and even more preferably from 1.0 to 3.0.

When the optical element produced by this mold is used as a diffraction grating used in an organic EL or thin-film device, the modal height H of the protrusions is preferably from 10 nm to 500 nm, and more preferably from 15 nm to 150 nm. When the modal height H is within the preferred range, an effect of improving the light extraction efficiency of the organic EL or thin-film device is obtained. When the optical element produced by this mold is used as an antireflective body targeted for visible light, the modal height H of the protrusions is preferably from 25 nm to 1,200 nm, and more preferably from 120 nm to 500 nm. When the optical element produced by this mold is used as an antireflective body targeted for infrared light, the modal height H of the protrusions is preferably from 250 nm to 10,000 nm, and more preferably from 750 nm to 10,000 nm. When the modal height H is within the preferred range, an effect of improving antireflective performance can be obtained.

(Functions and Effects)

The recesses and protrusions of the above optical element are random to an appropriate degree. Accordingly, directionality of diffracted light can be reduced and color shifting can be suppressed despite recesses and protrusions having a fine pitch being provided such that diffracted light is produced.

Furthermore, the recesses and protrusions of the optical element are not completely random, and have a certain order within the range corresponding to each of the areas $C_1$ to $C_n$. Accordingly, the pitch of the recesses and protrusions of the optical element can be easily adjusted, and the targeted optical function can be easily obtained.

Second Embodiment

In the first embodiment, the shape of the base material 11 is a planar sheet-like body. A mold 20A in this embodiment includes a base material 21A having a convex curved face. A mold 20B in this embodiment includes a base material 21B having a concave curved face. Hereinafter, this embodiment is described in detail with reference to FIGS. 9 to 13.

<Mold for Producing Optical Element>

Figure 9:
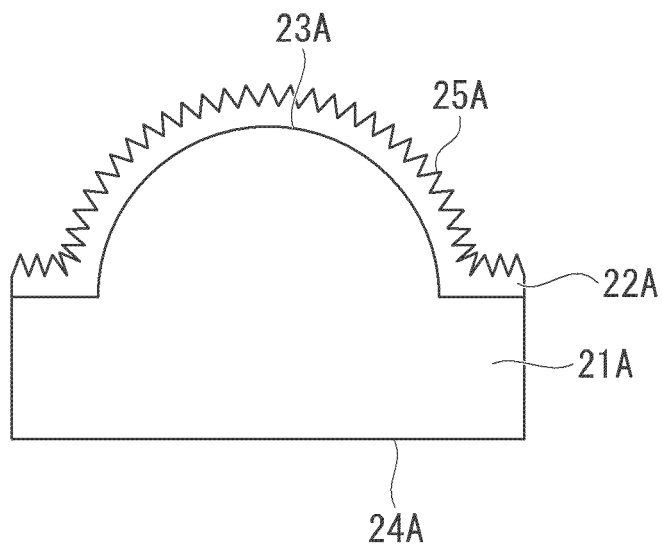
FIG. 9 is a cross-sectional view schematically illustrating a second embodiment of the mold for manufacturing an optical element of the present invention.

The mold 20A of this embodiment has, as illustrated in FIG. 9, the base material 21A of which a surface 23A has a convex curved face, and a recessing and protruding layer 22A provided on the surface 23A of the base material 21A.

Figure 10:
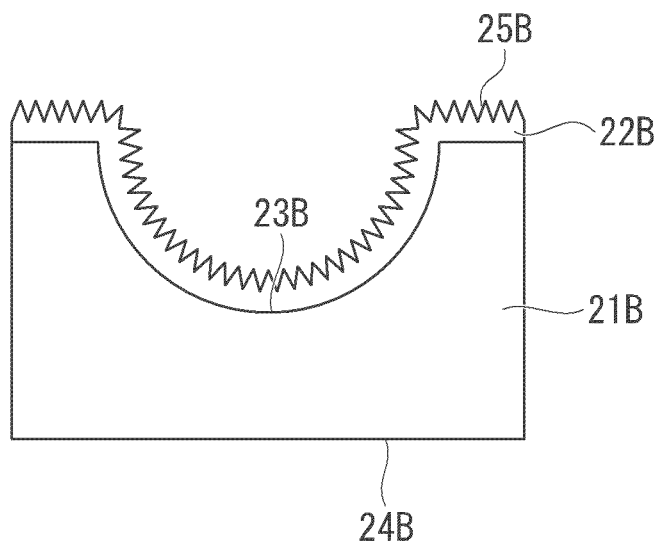
FIG. 10 is a cross-sectional view schematically illustrating the second embodiment of the mold for manufacturing an optical element of the present invention.

The mold 20B of this embodiment has, as illustrated in FIG. 10, the base material 21B of which a surface 23B has a concave curved face, and a recessing and protruding layer 22B provided on the surface 23A of the base material 21B.

(Base Material)

The materials of the base materials 21A and 21B are not particularly limited, and may be, for example, the materials described in the first embodiment.

The surface 23A has a convex curved face. The convex curved face may be a parabolic face or a spherical face. The shape of the convex curved face when viewed from the direction perpendicular to a surface 24A does not necessarily have to be round, and may be a shape of a circle being elongated along one axis or a plurality of axes. The length of the long axis of the convex curved face may be from 30 mm to 1300 mm, and is preferably from 200 mm to 500 mm. The radius of curvature in the cross-section along the long axis may be from 30 mm to 3,000 mm, and is preferably from 50 mm to 1,000 mm.

The shape of the surface 23A is obtained by machining the surface of the base material 21A using a method such as pressing, cutting, or grinding.

The surface 24A located opposite the surface 23A may be a flat face.

The surface 23B has a concave curved face. The concave curved face may be a parabolic face or a spherical face. The shape of the concave curved face when viewed from the direction perpendicular to the surface 24B does not necessarily have to be round, and may be a shape of a circle being elongated along one axis or a plurality of axes. The length of the long axis of the concave curved face may be from 30 mm to 1300 mm, and is preferably from 200 mm to 500 mm. The radius of curvature in the cross-section along the long axis may be from 30 mm to 3,000 mm, and is preferably from 50 mm to 1,000 mm.

The surface 24B located opposite the surface 23B may be a flat face.

The shape of the surface 23B, like the surface 23A, is obtained by machining the surface of the base material 21B using a method such as pressing, cutting, or grinding.

(Recessing and Protruding Layer)

The recessing and protruding layer 22A is a layer of which the face that abuts the material of the optical element is a recessing and protruding face 25A. The recessing and protruding layer 22B is a layer of which the face that abuts the material of the optical element is a recessing and protruding face 25B. The recessing and protruding layers 22A and 22B are the same as the recessing and protruding layer 12 described in the first embodiment except that they are formed on the surface 23A or 23B having a convex curved face or concave curved face.

As illustrated in FIGS. 9 and 10, when the curvature of the surface 23A or 23B having a convex curved face or concave curved face is relatively large compared to the area thereof, the axial direction of the recesses and protrusions of the recessing and protruding face 25A or 25B formed on the surface is close to the normal direction of the surface 23A or 23B.

Figure 12:
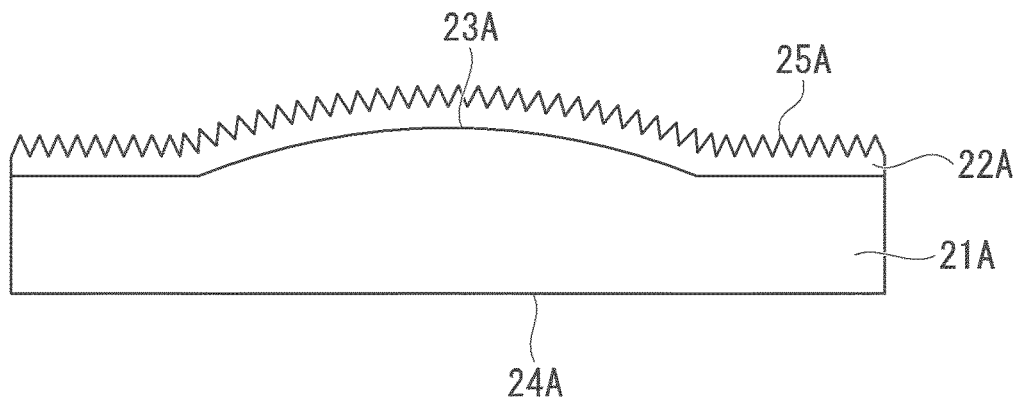
FIG. 12 is a cross-sectional view schematically illustrating the second embodiment of the mold for manufacturing an optical element of the present invention.
Figure 13:
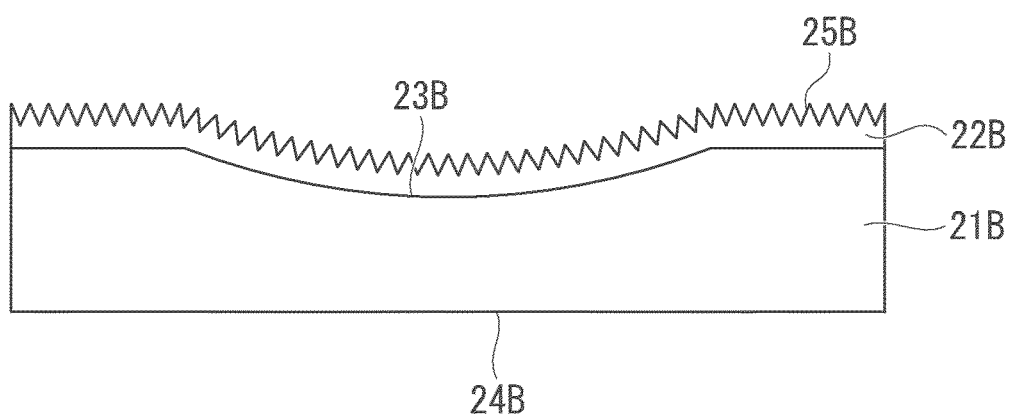
FIG. 13 is a cross-sectional view schematically illustrating the second embodiment of the mold for manufacturing an optical element of the present invention.

Conversely, as illustrated in FIGS. 12 and 13, when the curvature of the surface 23A or 23B having a convex curved face or concave curved face is relatively small compared to the area thereof, the axial direction of the recesses and protrusions of the recessing and protruding face 25A or 25B formed on the surface is close to the direction perpendicular to the surface 24A or 24B (the recessing and protruding layer 22A or 22B is the face that abuts the surface 24A or 24B).

(Functions and Effects)

Due to the fact that the molds 20A and 20B for manufacturing an optical element of this embodiment are formed using the method for creating the recessing and protruding layers 22A and 22B to be described later, the pitch of the recesses and protrusions can be easily adjusted and the targeted optical function can be easily obtained even when there are recesses and protrusions on the surface as in the base materials 21A and 21B. Accordingly, directionality of diffracted light can be reduced and color shifting can be suppressed despite recesses and protrusions having a fine pitch being provided such that diffracted light is produced.

<Method for Producing Mold>

An embodiment of a method for producing the above molds 20A and 20B is described.

The production method of this embodiment, similar to the first embodiment, has a film deposition step, a particle arrangement step, and an etching step. A description of a step which is the same as in the first embodiment will be omitted. Note that in the description below, a method for producing the mold 20A is described as an example.

(Film Deposition Step)

The film deposition step is a step in which an inorganic film which will subsequently become the recessing and protruding layer 22A is deposited on the surface 23A of the base material 21A.

The film deposition method of the inorganic film in the film deposition step may be any of physical vapor deposition (PVD) such as sputtering or vacuum deposition, chemical vapor deposition (CVD), or plating (electrolytic, electroless), but sputtering is preferred from the perspective of film deposition characteristics on the surface 23A, which has a convex face.

The other conditions in the film deposition step are the same as in the first embodiment.

(Particle Arrangement Step, Affixation Step)

The particle arrangement step and the affixation step are the same as in the first embodiment.

[Etching Step]

The etching step is a step in which the inorganic film is dry-etched using the plurality of particles M as an etching mask. The specific method of the etching step is the same as in the first embodiment.

Figure 11A:
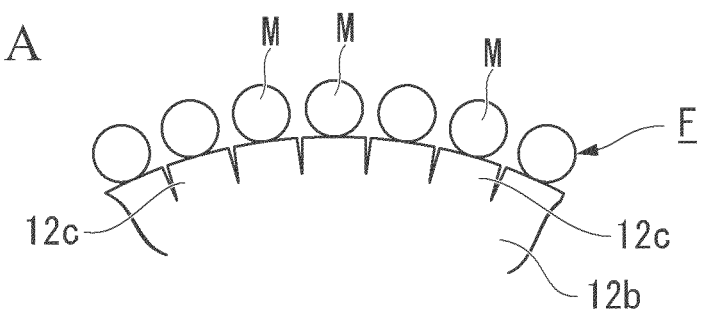
FIG. 11A is an explanatory diagram of a method of producing the mold for manufacturing an optical element of FIG. 9, illustrating a state after the particle arrangement step.
Figure 11B:
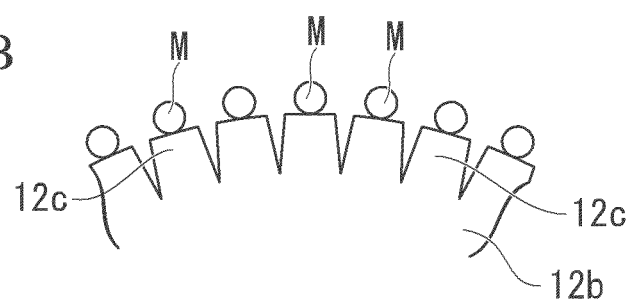
FIG. 11B is an explanatory diagram of the method of producing the mold for manufacturing an optical element of FIG. 9, illustrating a state during the etching step.
Figure 11C:
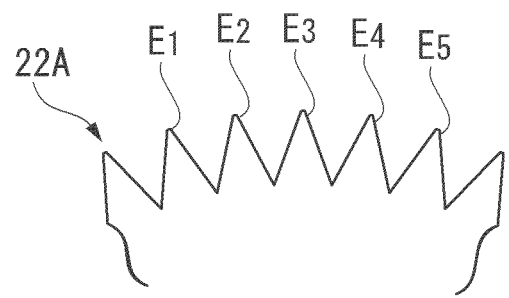
FIG. 11C is an explanatory diagram of the method for producing the mold for manufacturing an optical element of FIG. 9, illustrating a state after the etching step.

In the etching step, first, as illustrated in FIG. 11A, etching gas passes through the gaps between the particles M that constitute the single-particle film F and reaches the surface of the inorganic film 12b, so that grooves are formed in that portion, and round pillars 12c appear at the respective positions corresponding to the particles M. Then, as etching continues, the particles M on the round pillars 12c are gradually etched and become small, and at the same time, the grooves in the inorganic film 12b become deeper (FIG. 11B). Then, finally, the particles M disappear due to etching, and a plurality of conical protrusions $E_n$ are formed on one face of the inorganic film 12b (FIG. 11C).

The etching gas used in dry etching is the same as in the first embodiment. The etching device that performs dry etching and the etching conditions are also the same as in the first embodiment.

(Functions and Effects)

According to the method for producing a mold for manufacturing an optical element having the above-described film deposition step, particle arrangement step, and etching step, a mold in which recesses and protrusions having a plurality of areas of random area, shape, and crystal orientation are formed can be produced.

Furthermore, mold production can be simplified because the above production method is a method in which recesses and protrusions are directly formed on an inorganic film provided on the surface of a base material rather than a method in which recesses and protrusions are transferred by electroforming. Additionally, according to the above production method, fine recesses and protrusions can be formed on the surface of a mold for injection molding as well, and it is also possible to produce a sheet-like optical element on which recesses and protrusions have been formed on both faces.

Furthermore, in the above production method, since the particles M are used as the etching mask, the thickness of the etching mask can be made substantially constant even when there are recesses and protrusions on the surface as in the base materials 21A and 21B. Thus, the pitch of the recesses and protrusions on the recessing and protruding layer can be adjusted to a targeted value.

<Method for Manufacturing Optical Element>

As the method for manufacturing an optical element using the above mold, nanoimprinting, press molding, injection molding, electroforming, and the like may be used. When these methods are used, a shape transfer body (replica) in which a periodic grating structure is formed with high precision that is advantageous in achieving a viewing angle restriction function can be produced in high quantity with good reproducibility.

Among the above methods for manufacturing an optical element, nanoimprinting and injection molding are preferred due to being particularly suited to transfer of fine recesses and protrusions.

Specific examples of the method for manufacturing an optical element by nanoimprinting using the mold of the above embodiment include the methods described in the first embodiment.

By using the mold of this embodiment, it is possible to produce an optical element in which fine recesses and protrusions are formed on the surface of a concave lens or convex lens.

That is, the modal pitch, modal height, and shape of the fine recesses and protrusions of the light-emitting face of the optical element formed by the above method are determined depending on the application of the optical element. When the optical element is an antireflective body, the modal pitch of the fine recesses and protrusions is preferably adjusted according to the wavelength of light to be used. For example, when visible light of wavelength from approximately 400 nm to 750 nm is used, the pitch of the recesses and protrusions is preferably from not less than 50 nm to not greater than 300 nm. Additionally, when the pitch of fine recesses and protrusions is from not less than 50 nm to not greater than 150 nm, diffracted light in the visible light region can be reduced. When the infrared region having a wavelength of from approximately 750 nm to not greater than 10,000 nm is used, the recesses and protrusions having a modal pitch of not less than 500 nm and not greater than 5,000 nm is preferred.

The optimal aspect ratio of the fine recesses and protrusions is determined depending on the application of the optical element. For example, when producing a diffraction grating used in an organic EL or thin-film device using this mold, the aspect ratio of the protrusions $E_n$ in the recesses and protrusions is preferably from 0.1 to 1.0. For example, when producing an antireflective body using this mold, the aspect ratio of the protrusions $E_n$ in the recesses and protrusions is preferably from 0.5 to 4.0, and more preferably from 1.0 to 3.0.

When producing a diffraction grating used in an organic EL or thin-film device using this mold, the modal height H of the protrusions is preferably from 10 nm to 500 nm, and more preferably from 15 nm to 150 nm. When the modal height H is within the preferred range, an effect of improving the light extraction efficiency of the organic EL or thin-film device is obtained. When producing an antireflective body targeted for visible light using this mold, the modal height H of the protrusions is preferably from 25 nm to 1200 nm, and more preferably from 120 nm to 500 nm. When producing an antireflective body targeted for infrared light using this mold, the modal height H of the protrusions is preferably from 250 nm to 10,000 nm, and more preferably from 750 nm to 10,000 nm. When the modal height H is within the preferred range, an effect of improving antireflective performance can be obtained.

(Functions and Effects)

The recesses and protrusions of the above optical element are random to an appropriate degree. Accordingly, directionality of diffracted light can be reduced and color shifting can be suppressed despite recesses and protrusions having a fine pitch being provided such that diffracted light is produced.

Furthermore, the recesses and protrusions of the optical element are not completely random, and have a certain order within the range corresponding to each of the areas $C_1$ to $C_n$ of the molds 20A and 20B. Accordingly, the pitch of the recesses and protrusions of the optical element can be easily adjusted, and the targeted optical function can be easily obtained.

Additionally, by using the mold of this embodiment, it is possible to manufacture an optical element in which fine recesses and protrusions are formed on the surface of a concave lens or convex lens.

Other Embodiments

Note that the mold of the present invention is not limited to the above first and second embodiments.

For example, the shape of the base material is not particularly limited, and may be a round pillar. In the second embodiment, an example in which only the surface 23A of the base material 21A has a convex curved face has been described, but both surfaces may have a convex curved face. In the second embodiment, an example in which only the surface 23B of the base material 21B has a concave curved face has been described, but both surfaces may have a concave curved face.

Also, in the second embodiment, an example in which the base material 21A has one convex curved face has been described, but the base material 21A may have two or more convex curved faces. Similarly, in the second embodiment, an example in which the base material 21B has one concave curved face has been described, but the base material 21B may have two or more concave curved faces.

Furthermore, the mold having fine recesses and protrusions in the second embodiment may itself be used as an optical element such as an antireflective body, or diffraction grating. In the second embodiment, an example having a convex surface only on the surface 23A of the base material 21A has been described, but when the mold itself is used as an optical element such as an antireflective body, or diffraction grating, both surfaces may have a convex curved face. Similarly, in the second embodiment, both surfaces of the base material 21B may have a concave curved face.

In the present invention described above, the fine recessing and protruding face ends up being degraded over time when optical elements are produced using the mold of the present invention.

Because the mold of the present invention is a structure having a recessing and protruding layer provided on a base material, the recessing and protruding layer degraded over time is removed by dry etching, and then machining is performed and a new recessing and protruding layer is formed, thereby enabling the same mold to be reproduced with the base material reused.

When reusing the base material in this manner, the ratio of etching rates of the base material and recessing and protruding layer is preferably from 100 to 10,000, and more preferably from 1,000 to 10,000.

EXAMPLES

Working Example 1

An aqueous dispersion (dispersion) of 13.4% by mass spherical colloidal silica having an average particle size of 400.7 nm and a coefficient of variation of particle size of 3.3% was prepared. Note that the average particle size and coefficient of variation of particle size were determined from the peak obtained by fitting the particle size distribution determined by particle dynamic light scattering using a Zetasizer Nano-ZS (Malvern Instruments Ltd.) to a Gaussian curve.

Then, this dispersion was filtered with a membrane filter having a pore size of 1.2 μm, and then a hexyltrimethoxysilane hydrolysate aqueous solution of concentration 0.8% by mass was added to the dispersion that had passed through the membrane filter, and this was reacted for 4.5 h at approximately 40° C. At this time, the dispersion and the hydrolysate aqueous solution were mixed such that the mass of phenyltriethoxysilane was 0.02 times the mass of colloidal silica particles.

Then, methyl isobutyl ketone with a volume four times the volume of the dispersion after the reaction was added to that dispersion and adequately stirred, and hydrophobized colloidal silica was extracted by oil phase extraction.

A stainless steel sheet (both-sided mirror-polished) was prepared as a base material, and tungsten (W) was sputtered on the surface of the base material to form an inorganic film, and a workpiece was thereby obtained.

The hydrophobized colloidal silica dispersion after oil phase extraction was dripped at a drip rate of 0.01 mL/s onto the liquid surface (using water as the lower-layer water having a temperature of 25° C.) in a water tank (LB trough device) equipped with a surface pressure sensor for measuring surface pressure of the single-particle film and a movable barrier for compressing the single-particle film along the liquid surface. Note that the workpiece had been immersed beforehand in a substantially vertical direction in the lower-layer water in the water tank.

After that, ultrasonic waves (having a power of 50 W and a frequency of 1,500 kHz) were radiated for 10 min from inside the lower-layer water toward the water surface to promote two-dimensional close packing of the particles while volatilizing methyl isobutyl ketone, which is a solvent of the dispersion, and a single-particle film was formed on the water surface.

Next, this single-particle film was compressed by the movable barrier until the diffusion pressure reached 30 $mNm^{-1}$, and then the immersed workpiece was raised at a speed of 5 mm/min, and the single-particle film was thereby transferred onto the inorganic film of the workpiece.

Then, as binder, a hydrolysate solution of 1% by mass monomethyl trimethoxysilane was made to penetrate the workpiece on which the single-particle film had been formed, and then the excess hydrolysate solution was removed by treatment with a spin coater (3,000 rpm) for 1 min. After that, it was heated for 10 min at 100° C. to cause the binder to react, and a workpiece with a single-particle film etching mask made of colloidal silica was obtained.

One 10 μm×10 μm region of the single-particle film etching mask was randomly selected, and an atomic force microscope image of that portion was obtained. Waveform separation of the image was performed by Fourier transform, and an FFT image was obtained. Next, the distance from the zero-order peak to the first-order peak in the profile of the FFT image was determined, and its reciprocal was determined. The determined reciprocal of the distance is the modal pitch $B_1$ between particles in that region.

This process was similarly performed for a 10 μm×10 μm region in a total of 25 locations, the modal pitches $B_1$ to $B_{25}$ of the respective regions were determined, and the average thereof was calculated and used as the modal pitch B in formula (1). Note that at this time, the regions were set such that adjacent regions were approximately 5 mm apart from each other. The calculated modal pitch B was 412.3 nm.

Thus, when average particle size=400.7 nm and modal pitch B=412.3 nm were substituted into formula (1), the divergence D of the particle arrangement in the single-particle film etching mask of this example was 2.9%.

Next, gas-phase etching using a mixed gas with a ratio of $SF_6$:$BCl_3$ from 25:75 to 75:25 was performed on the workpiece with the single-particle film etching mask, so that fine recesses and protrusions were formed. The etching conditions included an antenna power of 1,500 W, a bias power of from 1,500 W to 2,000 W, and a gas flow rate of from 30 sccm to 50 sccm.

After etching, the average height h of the fine recesses and protrusions actually measured from the atomic force microscope image was 887.4 nm, and the average pitch C (average diameter d of circular bottom) of the arrangement of the fine recesses and protrusions determined by the same method as that used for the single-particle film etching mask was 410.8 nm, and the aspect ratio calculated from these was 2.16. When the divergence D' of the arrangement of these fine recesses and protrusions was determined using formula (2), it was 2.46%.

The mold with fine recesses and protrusions produced in this manner was affixed to the center of a 30 mm×30 mm stainless steel sheet (both-sided mirror-polished) such that the fine recessing and protruding face was exposed. The mold affixed to the stainless steel sheet was pressed with a pressure of 2.4 MPa against ultraviolet ray-curable resin (PAK-01CL manufactured by Toyo Gosei Co., Ltd.) applied on a pickup film (TETORON (registered trademark) film having a thickness of 50 μm manufactured by Teijin Ltd.) while the ultraviolet ray-curable resin was exposed with ultraviolet rays of 2.0 J and then cured. Then, the cured resin was gently peeled from the mold and then from the pickup film, and a nanoimprinted optical element of thickness approximately 1.0 mm was removed. The face opposite the recessing and protruding structure face of the optical element was flat.

Figure 7:
FIG. 7 is a diffraction pattern obtained by diffracted light of laser light output from an optical element of a working example being projected.

To check in-plane anisotropy of diffracted light, laser light from a point light source was made incident perpendicular to the face having a recessing and protruding shape of the produced optical element, and diffracted light emitted from the structure face was projected on a screen. Light incident on the optical element is diffracted depending on the crystal axis direction (coordinate axes set within the crystal; because it is a triangular lattice, the angle formed by axis a and axis b is 60°) of the diffraction grating. In this working example, because it has a structure in which the crystal axis directions of the areas containing a triangular lattice are randomly arranged, the diffraction angle (Z-axis direction) of the laser light is constant on the screen, as shown in FIG. 7, but in the X and Y directions, a ring-shaped bright line is projected, which indicates an isotropic crystal orientation. Therefore, it was confirmed that, with the method according to this working example, there is substantially no directionality of diffracted light.

Working Example 2

An aqueous dispersion (dispersion) of 7.2% by mass spherical colloidal silica having an average particle size of 120.2 nm and a coefficient of variation of particle size of 6.5% was prepared. Note that the average particle size and coefficient of variation of particle size were determined from the peak obtained by fitting the particle size distribution determined by particle dynamic light scattering using a Zetasizer Nano-ZS (Malvern Instruments Ltd.) to a Gaussian curve.

Then, this dispersion was filtered with a membrane filter having a pore size of 0.45 μm, and then a hydrolysate aqueous solution of 0.8% by mass hexyltrimethoxysilane was added to the dispersion that had passed through the membrane filter, and this was reacted for 2 h at approximately 40° C. At this time, the dispersion and the hydrolysate aqueous solution were mixed such that the mass of phenyltriethoxysilane was 0.02 times the mass of colloidal silica particles.

Then, methyl isobutyl ketone with a volume four times the volume of the dispersion after the reaction ended was added to that dispersion and adequately stirred, and hydrophobized colloidal silica was extracted by oil phase extraction.

A spherically concaved stainless steel sheet (both-sided mirror-polished) having a radius of curvature of 45 mm and a diameter of 30 mm was prepared as a base material, and chromium (Cr) was sputtered to a thickness of 1.0 μm on the base material surface to form an inorganic film, and a workpiece was thereby obtained.

The hydrophobized colloidal silica dispersion after oil phase extraction was dripped at a drip rate of 0.01 mL/s onto the liquid surface (using water as the lower-layer water having a temperature of 25° C.) in a water tank (LB trough device) equipped with a surface pressure sensor for measuring surface pressure of the single-particle film and a movable barrier for compressing the single-particle film along the liquid surface. Note that the workpiece had been immersed beforehand in a substantially vertical direction in the lower-layer water in the water tank.

After that, ultrasonic waves (having a power of 50 W and a frequency of 1,500 kHz) were radiated for 10 min from inside the lower-layer water toward the water surface to promote two-dimensional close packing of the particles while volatilizing methyl isobutyl ketone, which is a solvent of the dispersion, and a single-particle film was formed on the water surface.

Next, this single-particle film was compressed by the movable barrier until the diffusion pressure reached 30 mNm$^{-1}$, and then the immersed workpiece was raised at a speed of 5 mm/min, and the single-particle film was thereby transferred onto the inorganic film of the workpiece.

Then, as binder, a hydrolysate solution of 1% by mass monomethyl trimethoxysilane was made to penetrate the workpiece on which the single-particle film had been formed, and then the excess hydrolysate solution was removed by treatment with a spin coater (3,000 rpm) for 1 min. After that, it was heated for 10 min at 100° C. to cause the binder to react, and a workpiece with a single-particle film etching mask made of colloidal silica was obtained.

One 10 μm×10 μm region of the single-particle film etching mask was randomly selected, and an atomic force microscope image of that portion was obtained. Waveform separation of the image was performed by Fourier transform, and an FFT image was obtained. Next, the distance from the zero-order peak to the first-order peak in the profile of the FFT image was determined, and the reciprocal thereof was determined. The determined reciprocal is the modal pitch $B_1$ between particles in that region.

This process was similarly performed for a 10 μm×10 μm region in a total of 25 locations, the modal pitches $B_1$ to $B_{25}$ of the respective regions were determined, and the average thereof was calculated and used as the modal pitch B in formula (1). Note that at this time, the regions were set such that adjacent regions were approximately 5 mm apart from each other. The calculated modal pitch B was 121.8 nm.

Thus, when average particle size A=120.2 nm and modal pitch B=121.8 nm were substituted into formula (1), the divergence D of the particle arrangement in the single-particle film etching mask of this example was 1.3%.

Next, gas-phase etching using a mixed gas with a ratio of $Cl_2:O_2:CHF_3$ from 15:5:1 to 25:15:10 was performed on the workpiece with the single-particle film etching mask, so that fine recesses and protrusions were formed. The etching conditions included an antenna power of 1,500 W, a bias power of from 200 W to 800 W, and a gas flow rate of from 30 sccm to 50 sccm.

After etching, the average height h of the fine recesses and protrusions actually measured from the atomic force microscope image was 330.4 nm, and the average pitch C (average diameter d of circular bottom) of the arrangement of the fine recesses and protrusions determined by the same method as that used for the single-particle film etching mask was 118.8 nm, and the aspect ratio calculated from these was 2.78. When the divergence D' of the arrangement of these fine recesses and protrusions was determined using formula (2), it was 1.16%.

The mold provided with a concave portion having fine recesses and protrusions produced in this manner was combined with a mold for a lens body part, and a space having a lens form was provided. Then, this mold was mounted on an injection molder, and acrylic resin (PMMA) having fluidity at high temperature was injected into the space and then cooled. A lens with a fine structure, which is a molding, was then removed. The face opposite the recessing and protruding structure face of this lens with a fine structure was flat.

To confirm antireflective performance of the optical element, when normal incidence reflectance was measured using a USB2000 (manufactured by Ocean Optics, Inc.), the visible light surface reflectance was approximately 0.3%, and there was confirmed to be no wavelength dependence.

Comparative Example 1

A mold was obtained by forming fine recesses and protrusions in a triangular lattice arrangement at a pitch of 460 nm and height of 200 nm on a silicon sheet (having a thickness of 0.3 mm, and a size of 30 mm×30 mm) by interference exposure. The mold affixed to the stainless steel sheet was pressed with a pressure of 2.4 MPa against ultraviolet ray-curable resin (PAK-01 CL manufactured by Toyo Gosei Co., Ltd.) applied on a pickup film (TETORON (registered trademark) film having a thickness of 50 μm manufactured by Teijin Ltd.) while the ultraviolet ray-curable resin was exposed with ultraviolet rays of 2.0 J and then cured. Then, the cured resin was gently peeled from the mold and then from the pickup film, and a nanoimprinted optical element of thickness approximately 1.0 mm was removed.

Figure 8:
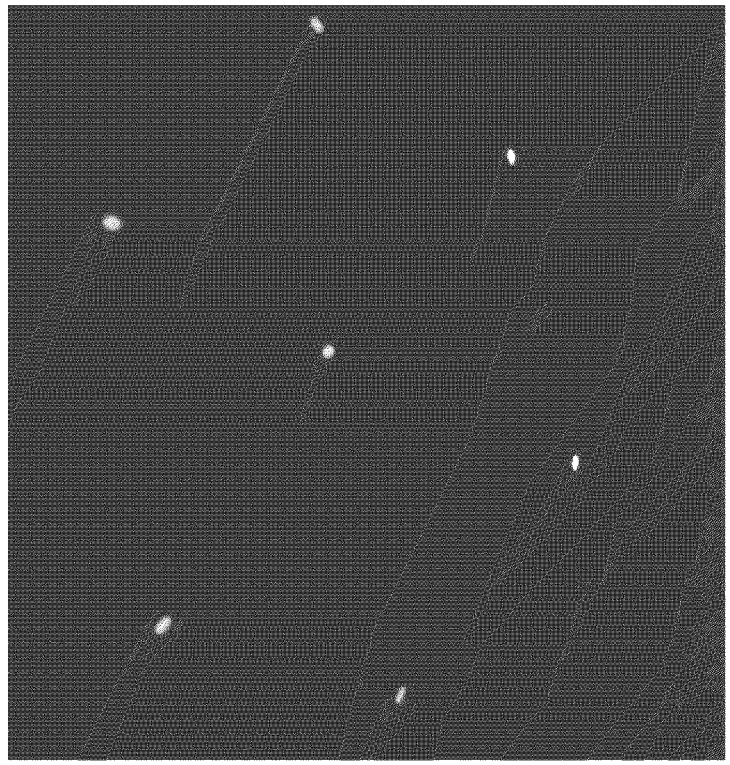
FIG. 8 is a diffraction pattern obtained by diffracted light of laser light output from an optical element of a comparative example being projected.

Similar to Working Example 1, laser light from a point light source was made incident perpendicular to the face having a recessing and protruding shape, and it was examined how the diffracted light appeared on a screen. In a comparative example in which monocrystalline fine recesses and protrusions were formed by interference exposure, light incident on the optical element was diffracted, and bright points corresponding to the vertices of a regular hexagon dependent on a triangular lattice appeared, as shown in FIG. 8. Therefore, it was confirmed that the fine recesses and protrusions produced by interference exposure have high directionality of diffracted light.

Comparative Example 2

A spherically concaved stainless steel sheet (both-sided mirror-polished) having a radius of curvature of 45 mm and a diameter of 30 mm was prepared as a base material, and fine processing was performed by the particle mask method according to the same method as Working Example 2 except that no etching layer was provided, and a lens with a fine structure was obtained. The average height h of the fine recesses and protrusions was 18.6 nm, the average pitch C (average diameter d of circular bottom) of the fine recesses and protrusions was 115.7 nm, and the aspect ratio calculated from these was 0.16. When the antireflective performance of the optical element was confirmed, the visible light surface reflectance was approximately 5.2%.

REFERENCE SIGNS LIST

10 Mold
11 Base material
12 Recessing and protruding layer
12a Recessing and protruding face
12b Inorganic film
12c Round pillar
M Particle
S Workpiece
V Water tank
W Lower-layer water
X Side face

What is claimed is:

1. A mold for manufacturing an optical element, comprising:
   a base material; and
   a recessing and protruding layer formed on a surface of the base material, having a recessing and protruding structure;
   the recessing and protruding structure having a plurality of areas continuously arranged in a positional relationship in which a central point of seven adjacent protrusions is an intersection point of diagonal lines of six vertices of a regular hexagon, and when an atomic force microscope (AFM) image is obtained for a square region whose edge length is from 30 to 40 times a modal pitch P of the protrusions on the recessing and protruding structures, an ellipse of the maximum area circumscribed by a boundary line of one area is drawn, wherein the ellipse is represented by formula (α) below:

$$X^2/a^2 + Y^2/b^2 = 1 \qquad (\alpha)$$

and the mold fulfills requirements (i) to (iii) below:
   (i) when the modal pitch P of the recessing and protruding structure is less than 500 nm, the standard deviation of $\pi ab$ in the above formula (α) (of a plurality of areas) within a 10 mm×10 mm AFM image measurement range is not less than 0.08 μm², when the modal pitch P of the recessing and protruding structure is from not less than 500 nm to less than 1,000 nm, the standard deviation of $\pi ab$ in the above formula (α) (of a plurality of areas) within a 10 mm×10 mm AFM image measurement range is not less than 1.95 μm², and when the modal pitch P of the recessing and protruding structure is not less than 1,000 nm, the standard deviation of $\pi ab$ in the above formula (α) (of a plurality of areas) within a 50 mm×50 mm AFM image measurement range is not less than 8.58 μm²;
   (ii) the standard deviation of the ratio of a to b (a/b) in the above formula (α) (of a plurality of areas) is not less than 0.1; and
   (iii) when a straight line K0 is drawn connecting the central points of any two adjacent protrusions in any area (I), and one area (II) adjacent to the area (I) is chosen, and six straight lines K1 to K6 are drawn connecting any protrusion in area (II) and the central points of six protrusions adjacent to that protrusion, when all of lines K1 to K6 are at an angle of not less than 3 degrees with respect to line K0, the crystal orientations of area (I) and area (ii) are different.

2. The mold for manufacturing an optical element according to claim 1, wherein the recessing and protruding layer is formed by a material containing at least one kind selected from the group consisting of (A1) and (B) to (D), wherein (A1) is a metal containing Si, Cr, Mo, W, Ta, Ti, or an alloy containing at least two of Si, Cr, Mo, W, Ta, Ni, and Ti, (B) is a metal oxide of at least one element selected from the group consisting of Si, Cr, Mo, W, Ta, Ni, and Ti, (C) is a metal nitride of at least one element selected from the group consisting of Si, Cr, Mo, W, Ta, Ni, and Ti, and (D) is a metal carbide of at least one element selected from the group consisting of Si, Cr, Mo, W, Ta, Ni, and Ti.

3. The mold for manufacturing an optical element according to claim 1, wherein the surface of the base material is flat.

4. The mold for manufacturing an optical element according to claim 1, wherein the surface of the base material has one of a concave curved face and a convex curved face.

\* \* \* \* \*